(12) United States Patent
Shin et al.

(10) Patent No.: US 12,132,501 B2
(45) Date of Patent: Oct. 29, 2024

(54) MEMORY MODULE, MEMORY SYSTEM, AND OPERATION METHOD OF MEMORY CONTROLLER

(71) Applicant: SAMSUNG ELECTRONICS CO., LTD., Suwon-si (KR)

(72) Inventors: Wonjae Shin, Seoul (KR); Sung-Joon Kim, Hwaseong-si (KR); Heedong Kim, Seoul (KR); Minsu Bae, Hwaseong-si (KR); Ilwoong Seo, Seoul (KR); Mijin Lee, Seoul (KR); Seung Ju Lee, Yongin-si (KR); Hyan Suk Lee, Suwon-si (KR); Insu Choi, Hwaseong-si (KR); Kideok Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 57 days.

(21) Appl. No.: 17/895,227

(22) Filed: Aug. 25, 2022

(65) Prior Publication Data

US 2023/0113615 A1 Apr. 13, 2023

(30) Foreign Application Priority Data

Oct. 12, 2021 (KR) .......................... 10-2021-0135051

(51) Int. Cl.
*H03M 13/19* (2006.01)
*G06F 11/10* (2006.01)
(Continued)

(52) U.S. Cl.
CPC .............. *H03M 13/19* (2013.01); *G06F 11/10* (2013.01); *G06F 11/1012* (2013.01); *G06F 11/1044* (2013.01); *G06F 11/1048* (2013.01); *G11C 8/08* (2013.01); *G11C 11/4085* (2013.01); *G11C 11/4096* (2013.01); *G11C 29/52* (2013.01); *H03M 13/611* (2013.01); *G11C 5/04* (2013.01)

(58) Field of Classification Search
CPC ..... H03M 13/19; H03M 13/611; G06F 11/10; G06F 11/1012; G06F 11/1044; G06F 11/1048; G11C 8/08; G11C 11/4085; G11C 11/4096; G11C 29/52; G11C 5/04
USPC ........ 714/768, 764, 769, 773, 799, 800, 802
See application file for complete search history.

(56) References Cited

U.S. PATENT DOCUMENTS 5,918,242 A * 6/1999 Sarma ................. G06F 12/0893
714/E11.041
7,051,265 B2 5/2006 Tsao et al.
(Continued)

FOREIGN PATENT DOCUMENTS

KR 10-2021-0050431 A 5/2021

OTHER PUBLICATIONS

EPO Written Opinion, Sep. 3, 2023. (Year: 2023).*

*Primary Examiner* — John J Tabone, Jr.
(74) *Attorney, Agent, or Firm* — Fish & Richardson P.C.

(57) ABSTRACT

A memory system includes a memory module that includes a first memory device through a fourth memory device and a first error correction code (ECC) device, and a memory controller that exchanges first user data with each of the first memory device through the fourth memory device through 8 data lines and exchanges first ECC data with the first ECC device through 4 data lines. The memory controller includes an ECC engine that corrects a 32-random bit error of the first user data, based on the first ECC data.

19 Claims, 16 Drawing Sheets

(51) Int. Cl.
*G11C 5/04* (2006.01)
*G11C 8/08* (2006.01)
*G11C 11/408* (2006.01)
*G11C 11/4096* (2006.01)
*G11C 29/52* (2006.01)
*H03M 13/00* (2006.01)

(56) References Cited

U.S. PATENT DOCUMENTS

| | | |
|---|---|---|
| 8,862,953 B2 | 10/2014 | Gollub et al. |
| 9,235,466 B2 | 1/2016 | Sohn et al. |
| 9,691,505 B2 | 6/2017 | Das et al. |
| 10,176,852 B2 * | 1/2019 | Park .................. G11C 8/18 |
| 2004/0123223 A1 * | 6/2004 | Halford ............ H03M 13/3761 |
| | | 714/E11.034 |
| 2013/0168774 A1 * | 7/2013 | Jeon .................. H10B 12/50 |
| | | 257/368 |
| 2014/0237157 A1 | 8/2014 | Takefman et al. |
| 2016/0224414 A1 * | 8/2016 | Trombley ............ H03M 13/17 |
| 2017/0004035 A1 * | 1/2017 | Suh .................. G11C 29/52 |
| 2017/0147431 A1 * | 5/2017 | West .................. G06F 3/0619 |
| 2017/0147432 A1 * | 5/2017 | Suh .................. G06F 3/0679 |
| 2019/0034270 A1 * | 1/2019 | Byun .................. G06F 11/1068 |
| 2019/0377632 A1 * | 12/2019 | Oh .................... G11C 13/0004 |
| 2020/0081774 A1 * | 3/2020 | Kumano ................ G11C 29/52 |
| 2020/0133769 A1 * | 4/2020 | Bains .................. G06F 11/1048 |
| 2020/0135292 A1 * | 4/2020 | Kim .................. G11C 29/783 |
| 2020/0272564 A1 * | 8/2020 | Keeth ................ G06F 12/0284 |
| 2021/0019225 A1 * | 1/2021 | Oh .................... G06F 11/1048 |
| 2021/0120669 A1 | 4/2021 | Ware et al. |
| 2023/0112776 A1 * | 4/2023 | Kim .................. G06F 11/1044 |
| | | 711/154 |
| 2023/0113615 A1 * | 4/2023 | Shin .................. G06F 11/1048 |
| | | 714/768 |

* cited by examiner

FIG. 3

| DQ | MEM0 | | | | | | | | MEM1 | | | | | | | | MEM2 | | | | | | | | MEM3 | | | | | | | | ECC0 | | | | |
|---|---|---|---|---|---|---|---|---|---|---|---|---|---|---|---|---|---|---|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |
| BL0 | | | | | | | | | | | | | | | | | | | | | | | | | | | | | | | | | | | | |
| BL1 | | | | | | | | | | | | | | | | | | | | | | | | | | | | | | | | | | | | |
| BL2 | | | | | | | | | | | | | | | | | | | | | | | | | | | | | | | | | | | | |
| BL3 | | | | | | | | | | | | | | | | | | | | | | | | | | | | | | | | | | | | |
| BL4 | | | | | | | | | | | | | | | | | | | | | | | | | | | | | | | | | | | | |
| BL5 | | | | | | | | | | | | | | | | | | | | | | | | | | | | | | | | | | | | |
| BL6 | | | | | | | | | | | | | | | | | | | | | | | | | | | | | | | | | | | | |
| BL7 | | | | | | | | | | | | | | | | | | | | | | | | | | | | | | | | | | | | |
| BL8 | | | | | | | | | | | | | | | | | | | | | | | | | | | | | | | | | | | | |
| BL9 | | | | | | | | | | | | | | | | | | | | | | | | | | | | | | | | | | | | |
| BL10 | | | | | | | | | | | | | | | | | | | | | | | | | | | | | | | | | | | | |
| BL11 | | | | | | | | | | | | | | | | | | | | | | | | | | | | | | | | | | | | |
| BL12 | | | | | | | | | | | | | | | | | | | | | | | | | | | | | | | | | | | | |
| BL13 | | | | | | | | | | | | | | | | | | | | | | | | | | | | | | | | | | | | |
| BL14 | | | | | | | | | | | | | | | | | | | | | | | | | | | | | | | | | | | | |
| BL15 | | | | | | | | | | | | | | | | | | | | | | | | | | | | | | | | | | | | |

DSET

DT_USER [64 Bytes]
DT_ECC [8 Bytes]

MEMORY MODULE, MEMORY SYSTEM, AND OPERATION METHOD OF MEMORY CONTROLLER

CROSS-REFERENCE TO RELATED APPLICATIONS

This U.S. non-provisional patent application claims priority under 35 U.S.C. § 119 to Korean Patent Application No. 10-2021-0135051, filed on Oct. 12, 2021 in the Korean Intellectual Property Office, the disclosure of which is incorporated by reference herein in its entirety.

BACKGROUND

1. Technical Field

Embodiments of the inventive concept(s) described herein relate to a semiconductor memory. More particularly, the present disclosure relates to a memory module, a memory system, and an operation method of a memory controller.

2. Description of the Related Art

A semiconductor memory device is classified as a volatile memory device or a nonvolatile memory device. A volatile memory device stores data which disappears when a power supply is turned off. Examples of a volatile memory device include a static random access memory (SRAM) or a dynamic random access memory (DRAM). A nonvolatile memory device stores data which are retained even when a power supply is turned off. Examples of a nonvolatile memory device include a flash memory device, a phase-change RAM (PRAM), a magnetic RAM (MRAM), a resistive RAM (RRAM), or a ferroelectric RAM (FRAM).

A DRAM may be widely used as a system memory of a computing system and may be included in the computing system in the form of a memory module such as a dual in-line memory module (DIMM). Some DIMMs provide an ECC function for recovering an error of stored data. As an example, an unbuffered DIMM (UDIMM) that is widely used in a user system such as a personal computer may provide an error correction function. Because the number of data lines included in the UDIMM is limited, the size of data to be used for error correction is relatively small. For this reason, a conventional UDIMM may support only a single bit error correction function.

SUMMARY

Embodiments of the present disclosure provide a memory module, a memory system, and an operation method of a memory controller, which are capable of improving reliability.

According to an embodiment, a memory system includes a memory module that includes a first memory device, a second memory device, a third memory device, a fourth memory device and a first error correction code (ECC) device, and a memory controller that exchanges first user data with each of the first memory device, the second memory device, the third memory device and the fourth memory device through 8 data lines and that exchanges first ECC data with the first ECC device through 4 data lines. The memory controller includes an ECC engine that corrects a 32-random bit error of the first user data, based on the first ECC data.

According to an embodiment, a memory controller is configured to control a memory module having a form factor of an unbuffered dual in-line memory module (UDIMM). An operating method of the memory controller includes generating detection data and correction data based on user data, writing the user data, the detection data, and the correction data in the memory module, reading the user data, the detection data, and the correction data from the memory module, correcting a random bit error of the user data based on the detection data and the correction data, and outputting the corrected user data.

According to an embodiment, a memory module having a form factor of an unbuffered dual in-line memory module (UDIMM) includes a first memory device that is connected with an external memory controller through a first data line, a second data line, a third data line, a fourth data line, a fifth data line, a sixth data line, a seventh data line and an eighth data line. The first memory device includes a first sub-array, a second sub-array, a third sub-array, a fourth sub-array, a fifth sub-array, a sixth sub-array, a seventh sub-array and an eighth sub-array that correspond to the first data line to the eighth data line, respectively, first sub-word line drivers that control word lines connected with the first sub-array and second sub-array, second sub-word line drivers that control word lines connected with the third sub-array and fourth sub-array, third sub-word line drivers that controls word lines connected with the fifth sub-array and sixth sub-array, and fourth sub-word line drivers that control word lines connected with the seventh sub-array and eighth sub-array. The first sub-word line drivers, the second sub-word line drivers, the third sub-word line drivers, and the fourth sub-word line drivers are physically separated from each other.

BRIEF DESCRIPTION OF THE FIGURES

The above and other objects and features of the present disclosure will become apparent by describing in detail embodiments thereof with reference to the accompanying drawings.

FIG. 3 is a diagram illustrating a data set transmitted or received through a first channel of a memory module of FIG. 2.

DETAILED DESCRIPTION

Below, embodiments of the present disclosure may be described in detail and clearly to such an extent that one of ordinary skill in the pertinent art(s) may easily implement the inventive concept(s) described herein.

Figure 1:
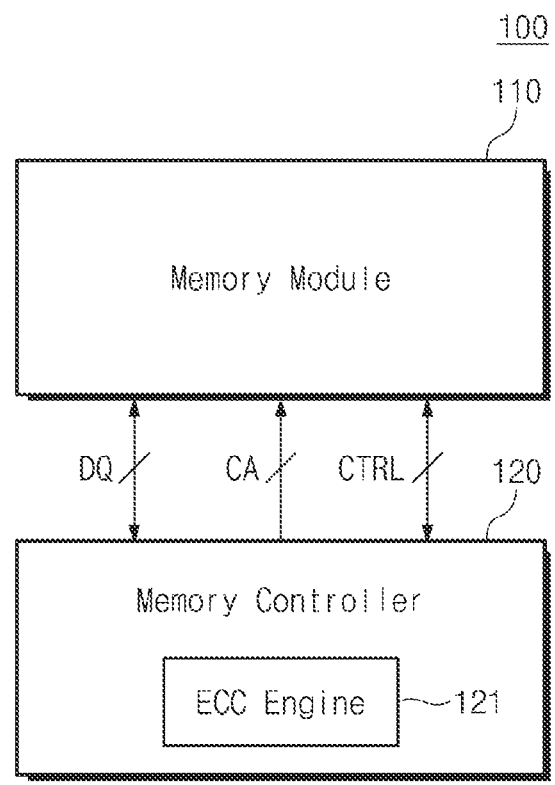
FIG. 1 is a block diagram illustrating a memory system according to an embodiment of the present disclosure.

FIG. 1 is a block diagram illustrating a memory system according to an embodiment of the present disclosure. Referring to FIG. 1, a memory system 100 may include a memory module 110 and a memory controller 120. In an embodiment, the memory system 100 may be one of information processing devices, which are configured to process a variety of information and to store the processed information, such as a personal computer (PC), a laptop, a server, a workstation, a smartphone, a tablet PC, a digital camera, and a black box.

The memory module 110 may be configured to store data or output the stored data, under control of the memory module 110. For example, the memory module 110 may be configured to receive a command signal through command/address lines CA from the memory controller 120, to receive a control signal CTRL through a separate line from the memory controller 120, and to output a data signal through data lines DQ in response to the received signals or store a received data signal in response to the received signals.

In an embodiment, the memory module 110 may include a plurality of memory devices. The memory module 110 may have a structure of a dual in-line memory module (DIMM). Below, to describe embodiment of the present disclosure easily, it is assumed that the memory module 110 is an unbuffered DIMM (UDIMM). However, the present disclosure is not limited thereto. For example, the memory module 110 or the dual in-line memory module may be implemented in various forms such as a small outline dual in-line memory module (SODIMM).

The memory controller 120 may be configured to control the memory module 110 by using various signals. For example, the memory controller 120 may transmit a command and an address signal to the memory module 110 through the command/address lines CA and may transmit the control signal CTRL to the memory module 110 through separate lines. The memory controller 120 may control a write operation and a read operation of the memory module 110 by using various signals. In the read operation of the memory module 110, the memory controller 120 may receive a data signal through the data lines DQ from the memory module 110; in the write operation of the memory module 110, the memory controller 120 may transmit a data signal to the memory module 110 through the data lines DQ.

In an embodiment, the memory module 110 and the memory controller 120 may communicate with each other through a given interface. The given interface may be a double data rate (DDR) interface, but the present disclosure is not limited thereto.

The memory controller 120 may include an ECC engine 121 (error correction code engine). The ECC engine 121 may generate ECC data for write data to be stored in the memory module 110. The generated ECC data may be stored in the memory module 110 together with the write data. Afterwards, when data are read from the memory module 110, the ECC engine 121 may detect and correct an error of the read data by using the ECC data corresponding to the read data.

In an embodiment, the memory module 110 may have an UDIMM structure. In a conventional UDIMM, because the number of input/output lines or data lines is limited, the size of ECC data included in one data set is limited. For this reason, the conventional UDIMM supports a single bit error correction (SEC) function of correcting a single bit error but fails to correct an error such as a multi-bit error or a chip error.

In contrast, according to the present disclosure, each of the plurality of memory devices included in the memory module 110 may be implemented such that an error range is classified as a specific range; in this case, even though the capacity of the ECC data is limited, a random bit error that occurs due to a fault of one of the plurality of memory devices may be corrected and recovered. A structure of the memory module 110 and the plurality of memory devices according to an embodiment of the present disclosure will be described in detail with reference to accompanying drawings.

Figure 2:
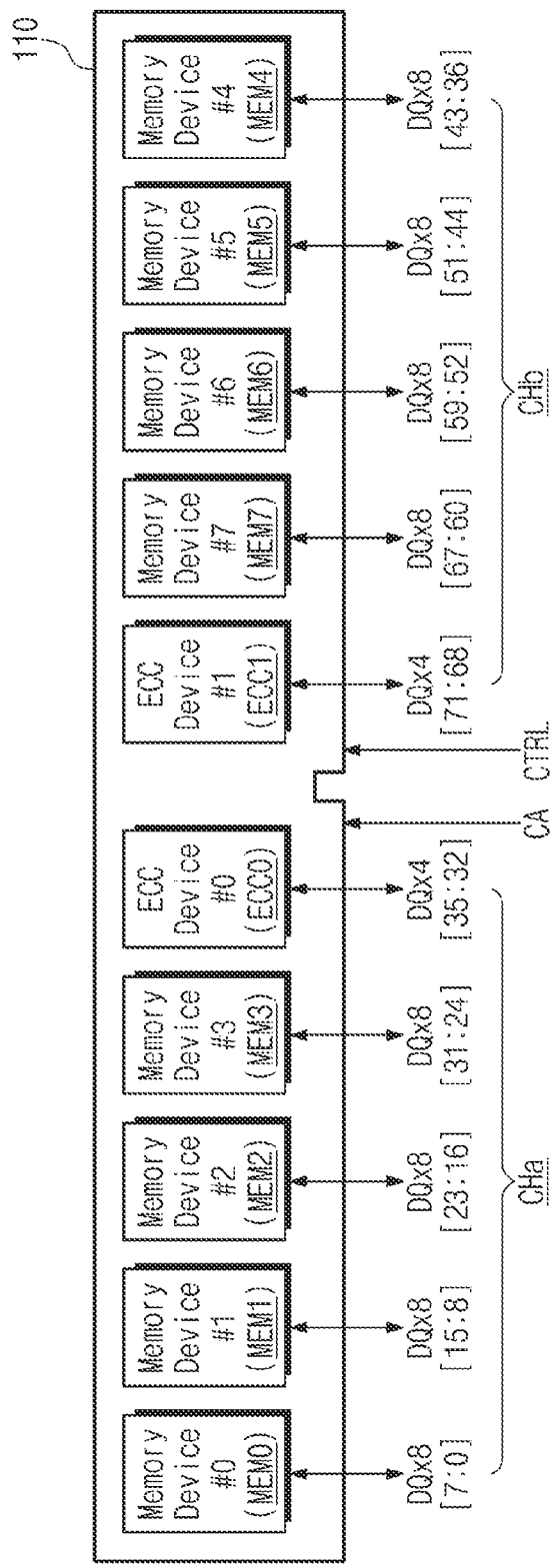
FIG. 2 is a block diagram illustrating a memory module of FIG. 1.
Figure 4:
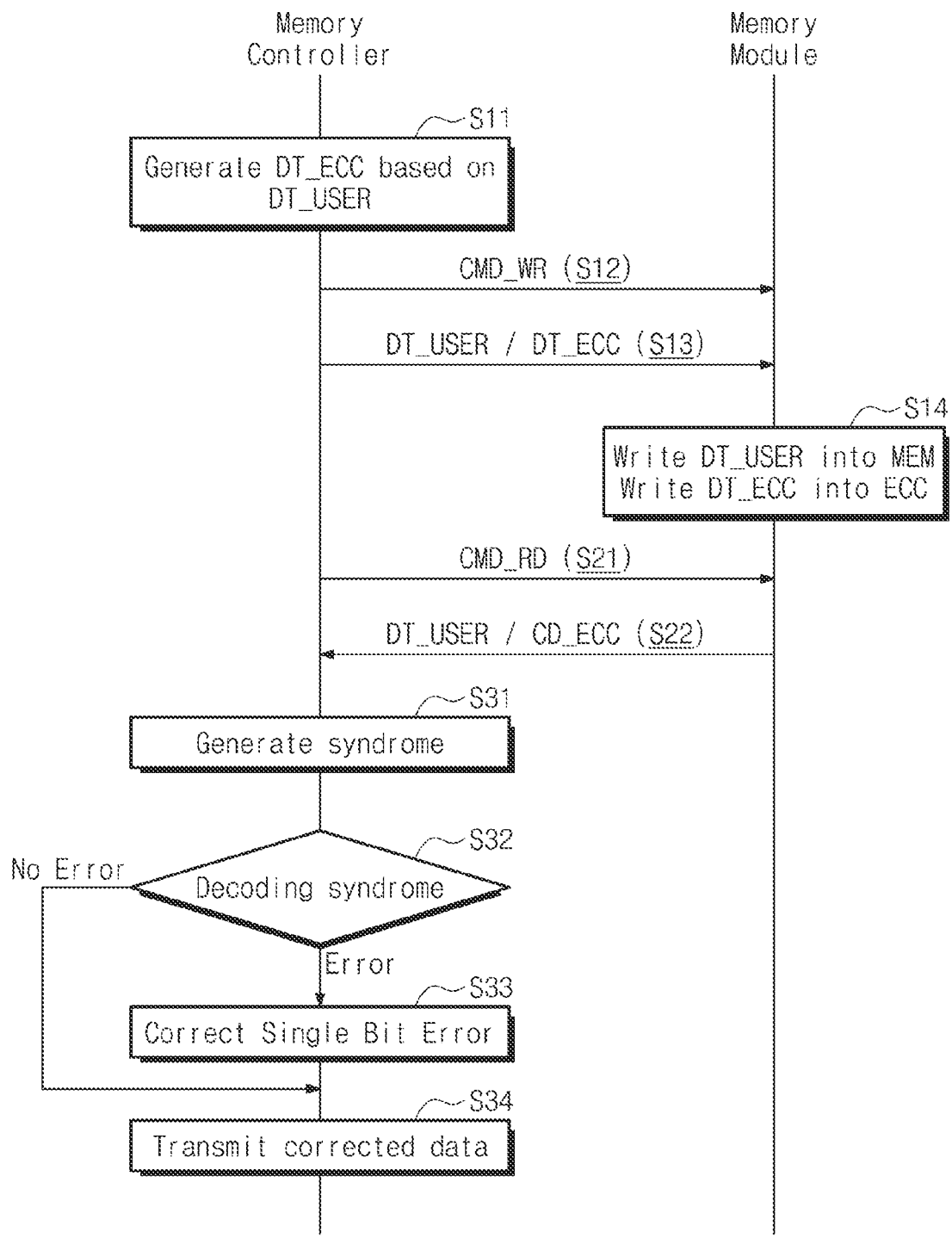
FIG. 4 is a flowchart illustrating an operation of a memory system of FIG. 1.

FIG. 2 is a block diagram illustrating a memory module of FIG. 1. FIG. 3 is a diagram illustrating a data set transmitted or received through a first channel of a memory module of FIG. 2. FIG. 4 is a flowchart illustrating an operation of a memory system of FIG. 1.

Referring to FIG. 1, FIG. 2, FIG. 3 and FIG. 4, the memory module 110 may include a first memory device MEM0, a second memory device MEM1, a third memory device MEM2, a fourth memory device MEM3, a fifth memory device MEM4, a sixth memory device MEM5, a seventh memory device MEM6, and an eighth memory device MEM7, and a first ECC device ECC0 and a second ECC device ECC1. Each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 and the first ECC device ECC0 and the second ECC device ECC1 may be a dynamic random access memory (DRAM) device. However, the present disclosure is not limited thereto.

Each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 and the first ECC device ECC0 and the second ECC device ECC1 may be configured to receive a command signal through the command/address lines CA from the memory controller 120, to receive the control signal CTRL through a separate line from the memory controller 120, and to output a data signal through data lines DQ in response to the received signals or store a received data signal in response to the received signals.

In an embodiment, each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 may exchange data with the memory controller 120 through 8 data lines DQx8. Each of the first ECC device ECC0 and the second ECC device ECC1 may exchange data with the memory controller 120 through 4 data lines DQx4.

For example, the memory module 110 may have the form factor of the UDIMM. The UDIMM may communicate with the memory controller 120 through a total of 72 data lines DQ[71:0]. The UDIMM may support a first channel Cha and a second channel CHb. The first channel Cha may include 36 data lines DQ[35:0], and the second channel CHb may include 36 data lines DQ[71:36]. The data lines DQ[35:0] of the first channel Cha may be connected with the plurality of memory devices MEM0 to MEM3 and the first ECC device ECC0.

As set forth herein with respect to at least FIG. 3, the memory module 110 may include a plurality of memory devices (e.g., the memory devices MEM0 to MEM3) and an ECC device (e.g., the first ECC device ECC0). The plurality of memory devices may be connected with the memory controller 120 through "a×N" data lines, wherein "a" indicates the number of the plurality of memory devices and N is a natural number greater than 1. The ECC device (e.g., the first ECC device ECC0) is connected with the memory controller 120 through "M" data lines, wherein M is a natural number smaller than N.

For example, the first memory device MEM0, the second memory device MEM1, the third memory device MEM2, and the fourth memory device MEM3 and the first ECC device ECC0 may be connected with the memory controller 120 through the first channel Cha. In this case, the first memory device MEM0 may be connected with the data lines DQ[7:0], the second memory device MEM1 may be connected with the data lines DQ[15:8], the third memory device MEM2 may be connected with the data lines DQ[23:16], the fourth memory device MEM3 may be connected with the data lines DQ[31:24], and the first ECC device ECC0 may be connected with the data lines DQ[35:32]. In an embodiment, the data lines DQ[31:0] may be input/output lines for transmitting or receiving user data DT_USER, and the data lines DQ[35:31] may be check bit lines CB for transmitting or receiving ECC data DT_ECC.

Likewise, the fifth memory device MEM4, the sixth memory device MEM5, the seventh memory device MEM6, and the eighth memory device MEM7 and the second ECC device ECC1 may be connected with the memory controller 120 through the second channel CHb. In this case, the fifth memory device MEM4 may be connected with the data lines DQ[43:36], the sixth memory device MEM5 may be connected with the data lines DQ[51:44], the seventh memory device MEM6 may be connected with the data lines DQ[59:52], the eighth memory device MEM7 may be connected with the data lines DQ[67:60], and the second ECC device ECC1 may be connected with the data lines DQ[71:68]. In an embodiment, the data lines DQ[67:36] may be input/output lines for transmitting or receiving the user data DT_USER, and the data lines DQ[71:68] may be check bit lines CB for transmitting or receiving the ECC data DT_ECC.

Through the first channel Cha and the second channel CHb, the memory controller 120 may write or read data in or from the memory module 110 in units of data set DSET.

In an embodiment, as illustrated in FIG. 3, one data set DSET may include the user data DT_USER and the ECC data DT_ECC. In the case where the memory module 110 operates with burst length of 16 (BL16), 16 bits may be transmitted or received through one data line. Because each of the first memory device MEM0, the second memory device MEM1, the third memory device MEM2 and the fourth memory device MEM3 is connected with the 8 data lines DQx8, the user data DT_USER that are transmitted or received to or from the first memory device MEM0, the second memory device MEM1, the third memory device MEM2 and the fourth memory device MEM3 through the first channel CHa may be 64 bytes (=32×16) (i.e., 512 bits). Because the first ECC device ECC0 is connected with the 4 data lines DQx4, the ECC data DT_ECC that are output from the first ECC device ECC0 through the first channel CHa may be 8 bytes (=4×16) (i.e., 64 bits).

In an embodiment, in the case where the sizes of the user data DT_USER and the ECC data DT_ECC included in one data set DSET are 64 bytes and 8 bytes, respectively, the ECC engine 121 of the memory controller 120 may support single bit error correction.

For example, as illustrated in FIG. 4, in operation S11, the memory controller 120 may generate the ECC data DT_ECC based on the user data DT_USER. In this case, the ECC data DT_ECC may include parity bits for supporting the single bit error correction of the user data DT_USER.

In operation S12, the memory controller 120 may perform an operation of transmitting a write command CMD_WR to the memory module 110. For example, the memory controller 120 may transmit the write command CMD_WR to the memory module 110 through the command/address lines CA.

In operation S13, the memory controller 120 may transmit the user data DT_USER and the ECC data DT_ECC to the memory module 110. For example, the memory controller 120 may transmit the user data DT_USER and the ECC data DT_ECC to the memory module 110 through the plurality of data lines DQ. In an embodiment, the user data DT_USER are transferred through data lines connected with memory devices (e.g., the first memory device MEM0 to the fourth memory device MEM3) of the memory module 110, and the ECC data DT_ECC are transferred through data lines connected with an ECC device (e.g., the first ECC device ECC0) thereof.

In operation S14, the memory module 110 may store the user data DT_USER in the memory devices (e.g., the first memory device MEM0 to the fourth memory device MEM3) and may store the ECC data DT_ECC in the ECC device (e.g., the first ECC device ECC0).

In operation S21, the memory controller 120 may perform an operation of transmitting a read command CMD_RD to the memory module 110. For example, to read the user data DT_USER written in the memory module 110 through operation S11 to operation S14, the memory controller 120 may transmit the read command CMD_RD to the memory module 110.

In operation S22, the memory module 110 may transmit the user data DT_USER and the ECC data DT_ECC to the memory controller 120. For example, the memory module 110 may transmit the user data DT_USER to the memory controller 120 through the data lines connected with the memory devices and may transmit the ECC data DT_ECC to the memory controller 120 through the data lines connected with the ECC device (e.g., the first ECC device ECC0).

In operation S31, the memory controller 120 may generate a syndrome. For example, the ECC engine 121 of the memory controller 120 may generate the syndrome by performing an XOR operation based on the user data DT_USER and the ECC data DT_ECC thus received.

In operation S32, the memory controller 120 may perform syndrome decoding. For example, the ECC engine 121 of the memory controller 120 may detect a location of an error included in the received user data DT_USER by decoding the generated syndrome.

When a result of the syndrome decoding indicates that an error is detected, in operation S33, the memory controller 120 may correct a single bit error. In operation S34, the memory controller 120 may output the corrected data to an external host.

When the result of the syndrome decoding indicates that an error is not detected, the memory controller 120 may perform operation S34. In this case, the data may be data that do not experience a separate error correction operation.

In an embodiment, through operation S31 to operation S33, the memory controller 120 may correct a single bit error of the user data DT_USER but may not correct a multi-bit error or a random bit error of user data DT_USER output from a memory device such as a first memory device MEM0. The reason is that the number of data lines used in the memory module 110 is limited, that is, that a ratio of the ECC data DT_ECC to the user data DT_USER included in one data set DSET is small. In other words, in the existing UDIMM form factor, an RAS (Reliability Availability Serviceability) characteristic supports single bit error correction but does not support a recovery operation for a multi-bit error, a random bit error, or a fail of a memory device.

For example, in the case where a fault occurs in one of the first memory device MEM0, the second memory device MEM1, the third memory device MEM2 and the fourth memory device MEM3, a 128-bit random error may occur in one data set DSET. However, because the ECC data DT_ECC transmitted or received to or from the memory module 110 have the size of 8 bytes in one data set DSET, it is impossible to correct the 128-bit random error by using the ECC data DT_ECC. That is, in the memory module 110 having the UDIMM form factor, the size of the ECC data DT_ECC included in one data set DSET may be relatively small due to the number of limited data lines for each channel; in this case, it is impossible to correct a random error bit due to the fault of the first memory device MEM0, the second memory device MEM1, the third memory device MEM2, the fourth memory device MEM3, the fifth memory device MEM4, the sixth memory device MEM3, the seventh memory device MEM6 and the eighth memory device MEM7 included in the memory module 110.

According to the present disclosure, in the case where a fault occurs in one of a plurality of memory devices included in a memory module, an occurrence range of a random bit error may be configured to be limited to a specific range. In this case, even though a fault occurs in a memory device, because a range of a random bit error is limited, the random bit error (i.e., the fault of the memory device) may be recovered by using the ECC data DT_ECC of the limited size. In an embodiment, the ECC engine 121 of the memory controller 120 may use or provide an ECC scheme for recovering a random error bit of a memory device. A structure of a memory device and an operation of a memory controller according to an embodiment of the present disclosure will be described in detail with reference to the following drawings.

Figure 5:
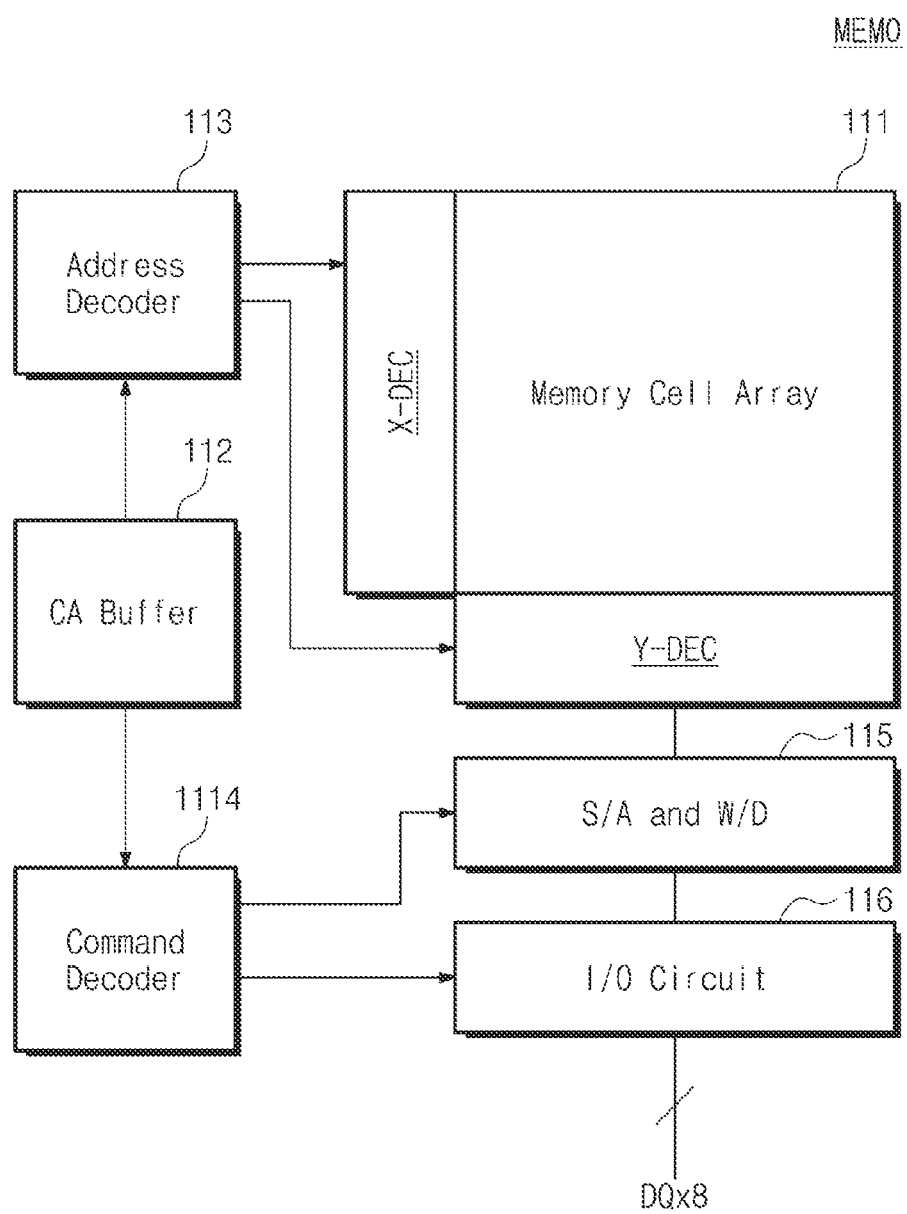
FIG. 5 is a block diagram illustrating a first memory device of memory devices included in a memory module of FIG. 2.

FIG. 5 is a block diagram illustrating a first memory device of memory devices included in a memory module of FIG. 2. For brevity of drawing and convenience of description, a structure of the first memory device MEM0 will be described with reference to FIG. 5, but the present disclosure is not limited thereto. Structures of the remaining memory devices including the second memory MEM1 to the eighth memory device MEM7 or the first ECC device ECC0 and the second ECC device ECC1 may be the same as or similar to that of the first memory device MEM0.

Referring to FIG. 2 and FIG. 5, the first memory device MEM0 may include a memory cell array 111, an X-decoder X-DEC, a Y-decoder Y-DEC, a command/address buffer 112, an address decoder 113, a command decoder 114, a sense amplifier and write driver 115, and an input/output circuit 116.

The memory cell array 111 may include a plurality of memory cells. The plurality of memory cells may be connected with word lines and bit lines. In an embodiment, each of the plurality of memory cells may be a DRAM cell, but the present disclosure is not limited thereto. For example, each of the plurality of memory cells may be implemented with one of various types of memory cells such as a PRAM cell, an MRAM cell, an RRAM cell, an FRAM cell, and a TRAM cell.

The X-decoder X-DEC may be connected with the word lines and may control the word lines under control of the address decoder 113. The Y-decoder Y-DEC may be connected with the bit lines and may control the bit lines under control of the address decoder 113.

The command/address buffer 112 may be configured to receive command and address signals from the memory controller 120 (or the register clock driver RCD) through the command/address lines CA and to temporarily store or buffer the received signals.

The address decoder 113 may decode the address signal stored in the command/address buffer 112 and may control the X-decoder X-DEC and the Y-decoder Y-DEC based on a decoding result.

The command decoder 114 may decode the command signal stored in the command/address buffer 112 and may control the components of the first memory device MEM0. For example, in the case where the command signal stored in the command/address buffer 112 corresponds to a write command (i.e., in the case where a command received from the memory controller 120 is the write command), the command decoder 114 may control an operation of the sense amplifier and write driver 115 (i.e., may activate the write driver) such that data received through the data lines DQ and the input/output circuit 116 are written in the memory cell array 111. Alternatively, in the case where the command signal stored in the command/address buffer 112 corresponds to a read command (i.e., in the case where the command received from the memory controller 120 is the read command), the command decoder 114 may control an operation of the sense amplifier and write driver 115 (i.e., may activate the sense amplifier) such that data stored in the memory cell array 111 are read out.

Under control of the command decoder 114, the sense amplifier and write driver 115 may read data stored in the memory cell array 111 or may write data in the memory cell array 111.

The input/output circuit 116 may receive data from the memory controller 120 through the data lines DQ or may transmit data to the memory controller 120 through the data lines DQ.

Figure 6:
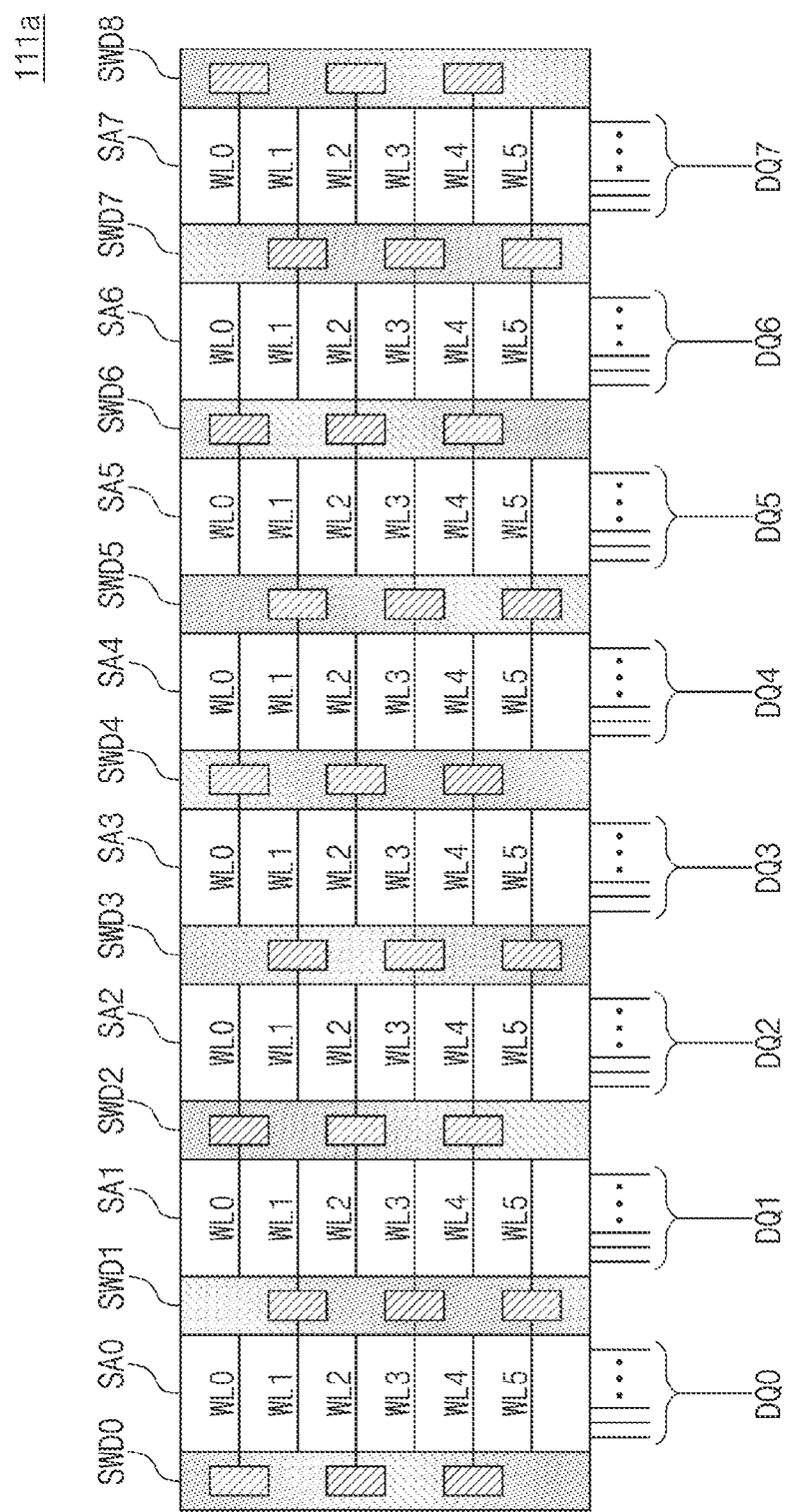
FIG. 6 is a diagram illustrating an example of a memory cell array of FIG. 5.
Figure 7:
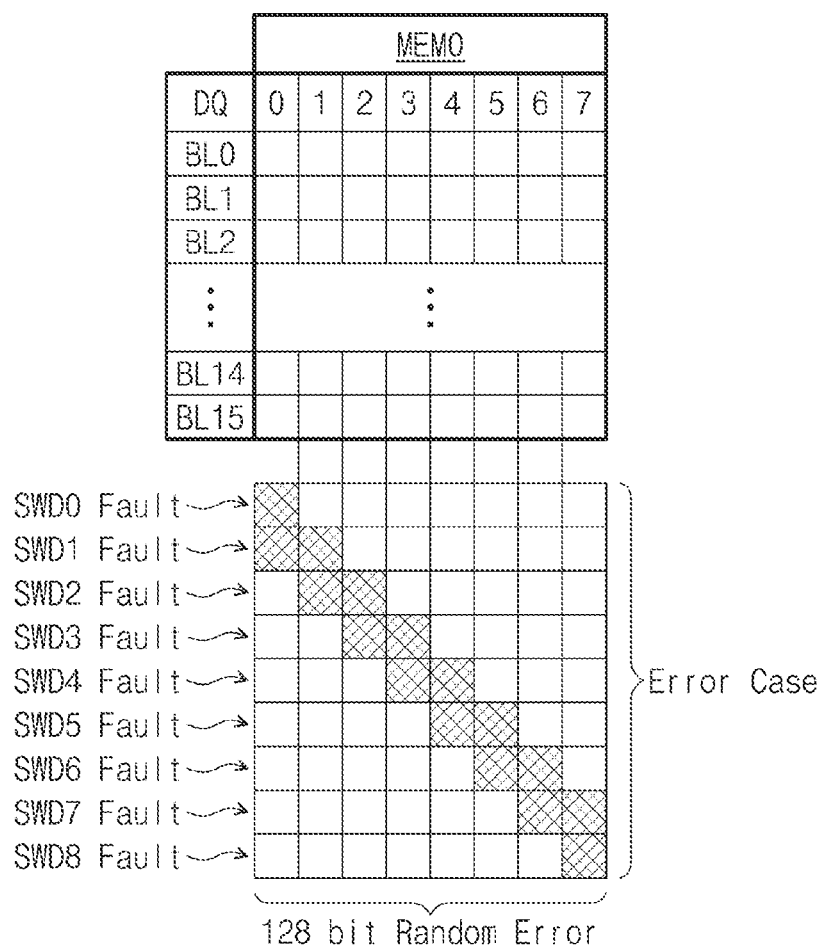
FIG. 7 is a diagram for describing an error case capable of occurring in a structure of a memory cell array of FIG. 6.

FIG. 6 is a diagram illustrating an example of a memory cell array of FIG. 5. FIG. 7 is a diagram for describing an error case capable of occurring in a structure of a memory cell array of FIG. 6. Referring to FIG. 5, FIG. 6 and FIG. 7, a memory cell array 111*a* may include a plurality of sub-arrays SA0 to SA7 and a plurality of sub-word line drivers SWD0 to SWD8.

Each of the plurality of sub-arrays SA0 to SA7 may include a plurality of memory cells. The plurality of memory cells may be connected with a plurality of word lines WL0 to WL5. The plurality of sub-arrays SA0 to SA7 may correspond to a plurality of data lines DQ0 to DQ7, respectively.

For example, the first sub-array SA0 may be connected with the first data line DQ0. In other words, data received through the first data line DQ0 may be stored in the memory cells of the first sub-array SA0, and data stored in the memory cells of the first sub-array SA0 may be output through the first data line DQ0.

The second sub-array SA1 may be connected with the second data line DQ1. In other words, data received through the second data line DQ1 may be stored in the memory cells of the second sub-array SA1, and data stored in the memory cells of the second sub-array SA1 may be output through the second data line DQ1.

The relationship between the remaining sub-arrays SA2 to SA7 and the remaining data lines DQ2 to DQ7 is similar to that described above, and thus, additional description will be omitted to avoid redundancy.

The plurality of sub-word line drivers SWD0 to SWD8 may be configured to drive the plurality of word lines WL0 to WL5 connected with the plurality of sub-arrays SA0 to SA7. For example, the first sub-word line driver SWD0 may drive even-numbered word lines WL0, WL2, and WL4 connected with the first sub-array SA0. The second sub-word line driver SWD1 may drive odd-numbered word lines WL1, WL3, and WL5 connected with the first sub-array SA0 and second sub-array SAL The third sub-word line driver SWD2 may drive even-numbered word lines WL0, WL2, and WL4 connected with the second sub-array SA1 and third sub-array SA2. The fourth sub-word line driver SWD3 may drive odd-numbered word lines WL1, WL3, and WL5 connected with the third sub-array SA2 and fourth sub-array SA3. The fifth sub-word line driver SWD4 may drive even-numbered word lines WL0, WL2, and WL4 connected with the fourth sub-array SA3 and fifth sub-array SA4. The sixth sub-word line driver SWD5 may drive odd-numbered word lines WL1, WL3, and WL5 connected with the fifth sub-array SA4 and sixth sub-array SA5. The seventh sub-word line driver SWD6 may drive even-numbered word lines WL0, WL2, and WL4 connected with the sixth sub-array SA5 and seventh sub-array SA6. The eighth sub-word line driver SWD7 may drive odd-numbered word lines WL1, WL3, and WL5 connected with the seventh sub-array SA6 and eighth sub-array SA7. The ninth sub-word line driver SWD8 may drive even-numbered word lines WL0, WL2, and WL4 connected with the eighth sub-array SA7.

For the above driving scheme of the sub-word line drivers SWD0 to SWD8, the plurality of sub-arrays SA0 to SA7 may be disposed between the plurality of sub-word line drivers SWD0 to SWD8. That is, the first sub-array SA0 may be interposed between the first sub-word line driver SWD0 and the second sub-word line driver SWD1; the second sub-array SA1 may be interposed between the second sub-word line drivers SWD1 and the third sub-word line drivers SWD2; the third sub-array SA2 may be interposed between the third sub-word line driver SWD2 and the fourth sub-word line driver SWD3; the fourth sub-array SA3 may be interposed between the fourth sub-word line driver SWD3 and the fifth sub-word line driver SWD4; the fifth sub-array SA4 may be interposed between the fifth sub-word line driver SWD4 and the sixth sub-word line driver SWD5; the sixth sub-array SA5 may be interposed between the sixth sub-word line driver SWD5 and the seventh sub-word line driver SWD6; the seventh sub-array SA6 may be interposed between the seventh sub-word line driver SWD6 and the eighth sub-word line driver SWD7; the eighth sub-array SA7 may be interposed between the eighth sub-word line driver SWD7 and the ninth sub-word line driver SWD8.

In an embodiment, in the case where one of the plurality of sub-word line drivers SWD0 to SWD8 is faulty, an error may be included in bits that are output from sub-arrays corresponding to the faulty sub-word line driver. In this case, a 128-random bit error may occur in the first memory device MEM0.

For example, as illustrated in FIG. 7, in the case where the first memory device MEM0 operates with the burst length of 16 (including burst BL0 to burst BL15), an error occurs at bits output through specific data lines depending on a location of a faulty sub-word line driver. In detail, in the case where the first sub-word line driver SWD0 is faulty, an error may be included in bit values that are output through the first data line DQ0 from the first sub-array SA0 connected with the word lines driven by the first sub-word line driver SWD0. In the case where the second sub-word line driver SWD1 is faulty, an error may be included in bit values that are output through the first data line DQ0 and second data line DQ1 from the first sub-array SA0 and second sub-array SA1 connected with the word lines driven by the second sub-word line driver SWD1. In the case where the third sub-word line driver SWD2 is faulty, an error may be included in bit values that are output through the second data lines DQ1 and third data lines DQ2 from the second sub-arrays SA1 and third sub-arrays SA2 connected with the word lines driven by the third sub-word line driver SWD2. In the case where the fourth sub-word line driver SWD3 is faulty, an error may be included in bit values that are output through the third data line DQ2 and fourth data line DQ3 from the third sub-array SA2 and fourth sub-array SA3 connected with the word lines driven by the fourth sub-word line driver SWD3. In the case where the fifth sub-word line driver SWD4 is faulty, an error may be included in bit values that are output through the fourth data line DQ3 and fifth data line DQ4 from the fourth sub-array SA3 and fifth sub-array SA4 connected with the word lines driven by the fifth sub-word line driver SWD4. In the case where the sixth sub-word line driver SWD5 is faulty, an error may be included in bit values that are output through the fifth data line DQ4 and sixth data line DQ5 from the fifth sub-array SA4 and sixth sub-array SA5 connected with the word lines driven by the sixth sub-word line driver SWD5. In the case where the seventh sub-word line driver SWD6 is faulty, an error may be included in bit values that are output through the sixth data line DQ5 and seventh data line DQ6 from the sixth sub-array SA5 and seventh sub-array SA6 connected with the word lines driven by the seventh sub-word line driver SWD6. In the case where the eighth sub-word line driver SWD7 is faulty, an error may be included in bit values that are output through the seventh data line DQ6 and eighth data line DQ7 from the seventh sub-array SA6 and eighth sub-array SA7 connected with the word lines driven by the eighth sub-word line driver SWD7. In the case where the ninth sub-word line driver SWD8 is faulty, an error may be included in bit values that are output through the eighth data line DQ7 from the eighth sub-array SA7 connected with the word lines driven by the ninth sub-word line driver SWD8.

As described above, because an error of a bit value output through one data line is associated with a fault of two sub-word lines, an error of bit values output through each data line may not be identified physically on the data line; in this case, an error capable of occurring due to the fault of the first memory device MEM0 (e.g., the fault of one sub-word line driver) may be a 128-random bit error.

Figure 8:
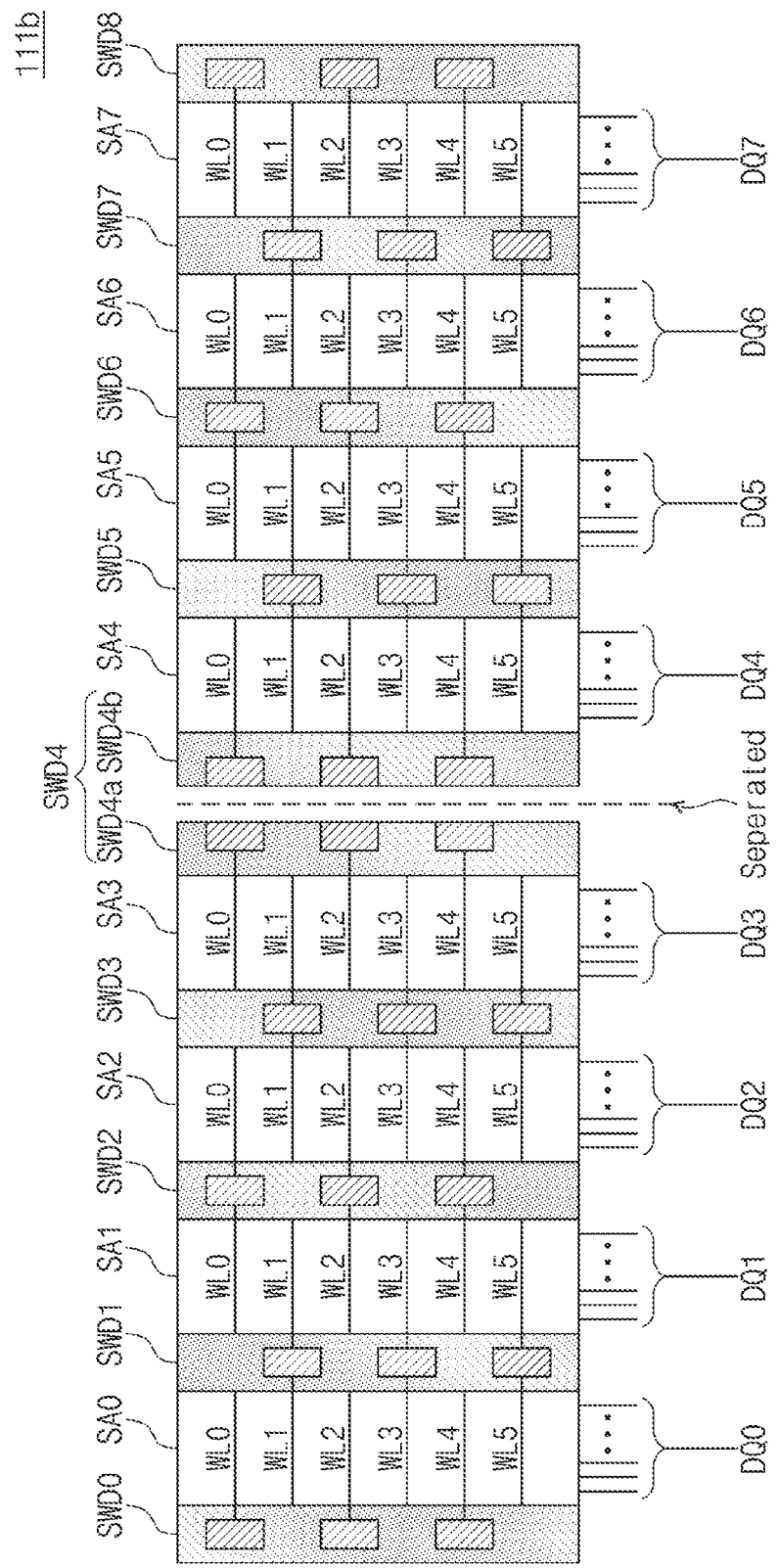
FIG. 8 is a diagram illustrating an example of a memory cell array of FIG. 5.
Figure 9:
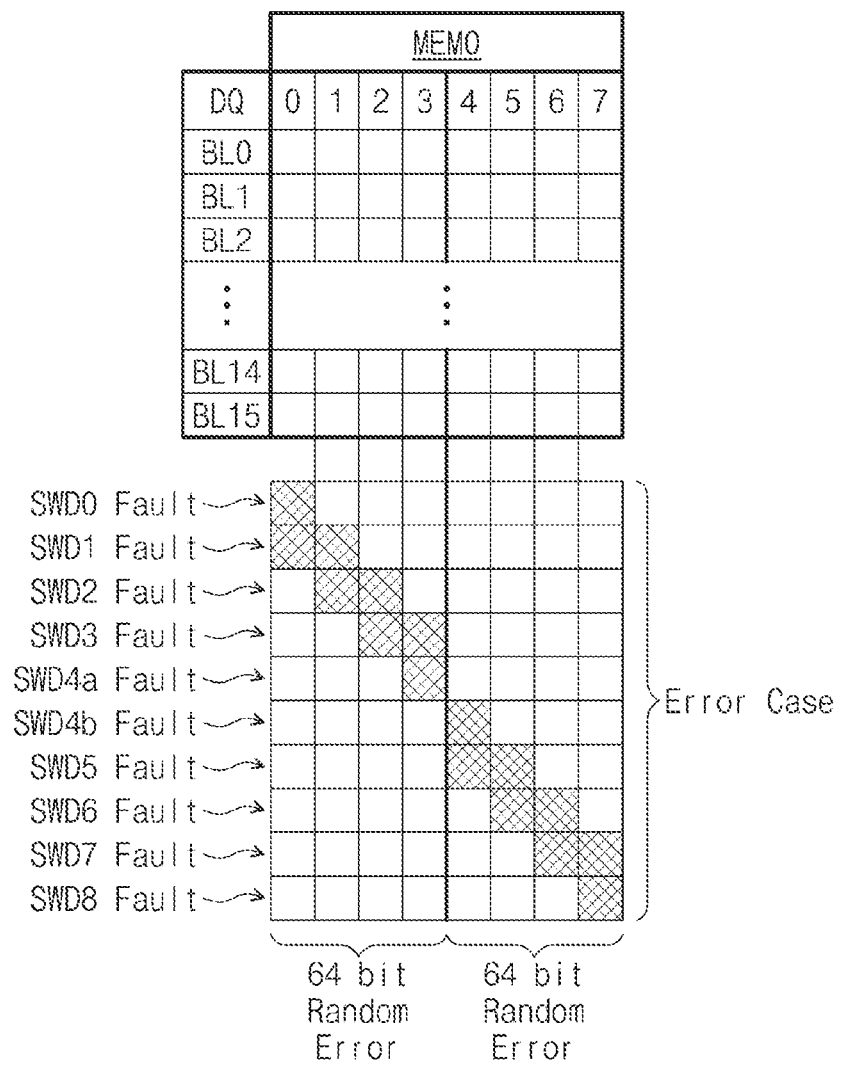
FIG. 9 is a diagram for describing an error case capable of occurring in a structure of a memory cell array of FIG. 8.

FIG. 8 is a diagram illustrating an example of a memory cell array of FIG. 5. FIG. 9 is a diagram for describing an error case capable of occurring in a structure of a memory cell array of FIG. 8. Referring to FIG. 5, FIG. 8, and FIG. 9, a memory cell array 111b may include a plurality of sub-arrays SA0 to SA7 and a plurality of sub-word line drivers SWD0 to SWD8. The plurality of sub-arrays SA0 to SA7 may correspond to the plurality of data lines DQ0 to DQ7, respectively. Configurations of some of the plurality of sub-arrays SA0 to SA7 and the plurality of sub-word line drivers SWD0 to SWD8 are similar to those described with reference to FIG. 6, and thus, additional description will be omitted to avoid redundancy.

Unlike the embodiment of FIG. 6, the fifth sub-word line driver SWD4 may be divided into two sub-word line drivers SWD4a and SWD4b. The sub-word line driver SWD4a may drive the even-numbered word lines WL0, WL2, and WL4 of the fourth sub-array SA3, and the sub-word line driver SWD4b may drive the even-numbered word lines WL0, WL2, and WL4 of the fifth sub-array SA4. In an embodiment, the two sub-word line drivers SWD4a and SWD4b may be components that are physically separated from each other and operate independently of each other. In this case, in the first memory device MEM0, a range of a random bit error due to a fault of a sub-word line driver may be limited to 64 bits.

For example, as illustrated in FIG. 9, in the case where one of the first, second, third, fourth and 5a-th sub-word line drivers SWD0, SWD1, SWD2, SWD3, and SWD4a is faulty, an error may occur in bit values output through the first to fourth data lines DQ0, DQ1, DQ2, and DQ3; in the case where one of the 5b-th, sixth, seventh, eighth and ninth sub-word line drivers SWD4b, SWD5, SWD6, SWD7, and SWD8 is faulty, an error may occur in bit values output through the fifth to eighth data lines DQ4, DQ5, DQ6, and DQ7. In this case, because a random bit error occurs in a state of being physically separated in units of 4 data lines, that is, in units of first to fourth data lines DQ0, DQ1, DQ2, and DQ3 or in units of fifth to eighth data lines DQ4, DQ5, DQ6, and DQ7, the range of the random bit error occurring in the first memory device MEM0 may be 64 bits.

Figure 10:
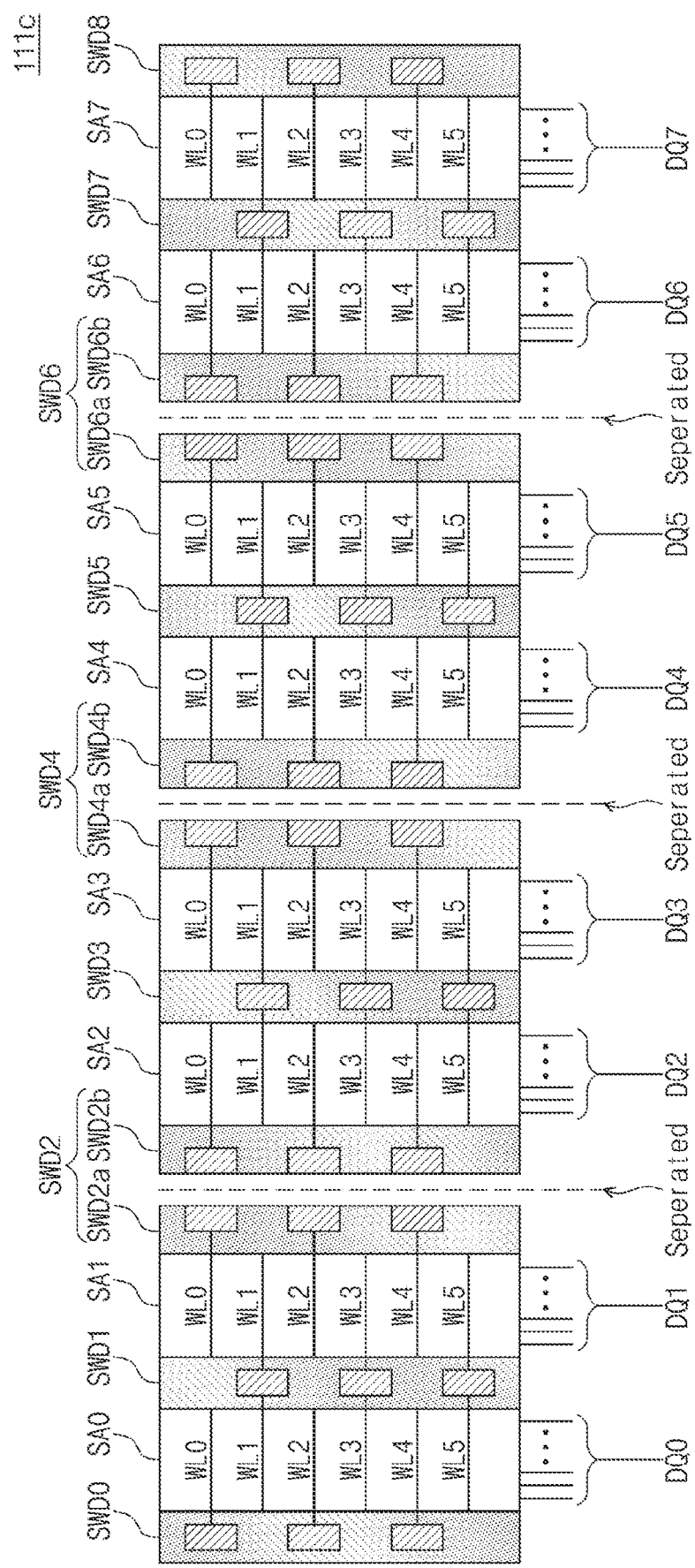
FIG. 10 is a diagram illustrating an example of a memory cell array of FIG. 5.
Figure 11:
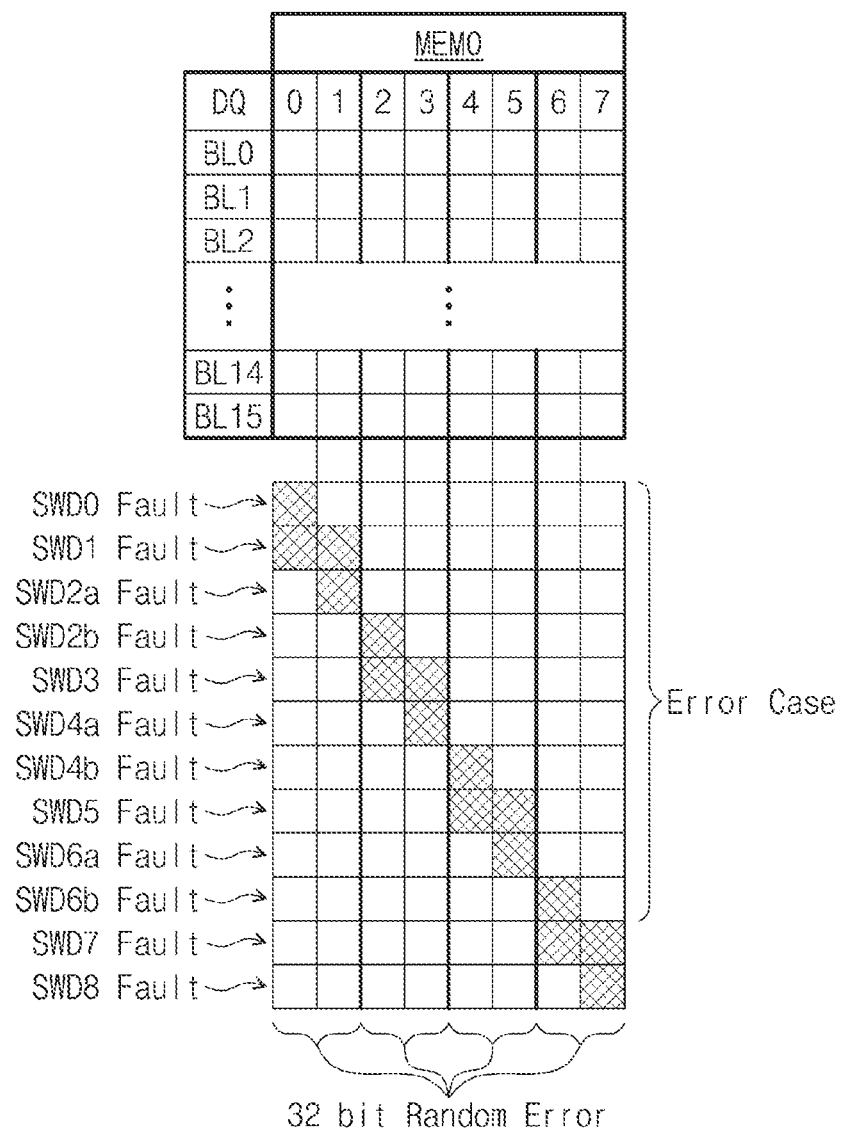
FIG. 11 is a diagram for describing an error case capable of occurring in a structure of a memory cell array of FIG. 10.

FIG. 10 is a diagram illustrating an example of a memory cell array of FIG. 5. FIG. 11 is a diagram for describing an error case capable of occurring in a structure of a memory cell array of FIG. 10.

Referring to FIG. 5, FIG. 10, and FIG. 11, a memory cell array 111c may include a plurality of sub-arrays SA0 to SA7 and a plurality of sub-word line drivers SWD0 to SWD8. The plurality of sub-arrays SA0 to SA7 may correspond to the plurality of data lines DQ0 to DQ7, respectively. The configurations of some of the plurality of sub-arrays SA0 to SA7 and the plurality of sub-word line drivers SWD0 to SWD8 are similar to those described with reference to FIG. 6, and thus, additional description will be omitted to avoid redundancy.

In an embodiment, each of the third, fifth, and seventh sub-word line drivers SWD2, SWD4, and SWD6 included in the memory cell array 111c illustrated in FIG. 11 may be divided into two separated sub-word line drivers.

For example, a sub-word line driver SWD2a may drive the even-numbered word lines WL0, WL2, and WL4 of the second sub-array SA1, and a sub-word line driver SWD2b may drive the even-numbered word lines WL0, WL2, and WL4 of the third sub-array SA2. A sub-word line driver SWD4a may drive the even-numbered word lines WL0, WL2, and WL4 of the fourth sub-array SA3, and a sub-word line driver SWD4b may drive the even-numbered word lines WL0, WL2, and WL4 of the fifth sub-array SA4. A sub-word line driver SWD6a may drive the even-numbered word lines WL0, WL2, and WL4 of the sixth sub-array SA5, and a sub-word line driver SWD6b may drive the even-numbered word lines WL0, WL2, and WL4 of the seventh sub-array SA6. In an embodiment, the two sub-word line drivers SWD2a and SWD2b may be components that are physically separated from each other and operate independently of each other; the two sub-word line drivers SWD4a and SWD4b may be components that are physically separated from each other and operate independently of each other; the two sub-word line drivers SWD6a and SWD6b may be components that are physically separated from each other and operate independently of each other. In this case, in the first memory device MEM0, a range of a random bit error due to a fault of a sub-word line driver may be limited to 32 bits.

For example, as illustrated in FIG. 11, in the case where one of the first, second and 3a-th sub-word line drivers SWD0, SWD1, and SWD2a is faulty, an error may occur in bit values output through the first and second data lines DQ0 and DQ1; in the case where one of the 3b-th, fourth, and 5a-th sub-word line drivers SWD2b, SWD3, and SWD4a is faulty, an error may occur in bit values output through the third data line DQ2 and fourth data line DQ3; in the case where one of the 5b-th, sixth, and 7a-th sub-word line drivers SWD4b, SWD5, and SWD6a is faulty, an error may occur in bit values output through the fifth data line DQ4 and sixth data line DQ5; in the case where one of the 7b-th, eighth, and ninth sub-word line drivers SWD6b, SWD7, and SWD8 is faulty, an error may occur in bit values output through the seventh data line DQ6 and eighth data line DQ7.

In this case, because a random bit error occurs in a state of being physically separated in units of 2 data lines, that is, in units of first and second data lines DQ0 and DQ1, in units of third data line DQ2 and fourth data line DQ3, in units of fifth data line DQ4 and sixth data line DQ5, or in units of seventh data line DQ6 and eighth data line DQ7, the range of the random bit error occurring in the first memory device MEM0 may be 32 bits.

In an embodiment, in the case where the memory module 110 has the UDIMM form factor and operates with the burst length of 16, the ECC data DT_ECC included in one data set DSET output through one channel may be 8 bytes. It is impossible to correct the 128-random bit error or the 64-random bit error by using the 8-byte ECC data DT_ECC. That is, in general, in the case where the memory module 110 has the UDIMM form factor, the 128-random bit error or the 64-random bit error that occurs in each of memory devices is incapable of being corrected, and the memory module 110 and the memory controller 120 may be configured to support single bit error correction (SEC).

However, as illustrated in FIG. 10, according to the present disclosure, the memory module 110 having the UDIMM form factor may be configured to determine a random bit error, which occurs each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7, in units of two adjacent data lines, and thus, an occurrence range of a random bit error may be limited to 32 bits. In this case, the 32-random bit error may be corrected or recovered by using the 8-byte ECC data DT_ECC, and the ECC engine 121 of the memory controller 120 may be configured to support correction and recovery for the 32-random bit error.

Figure 12:
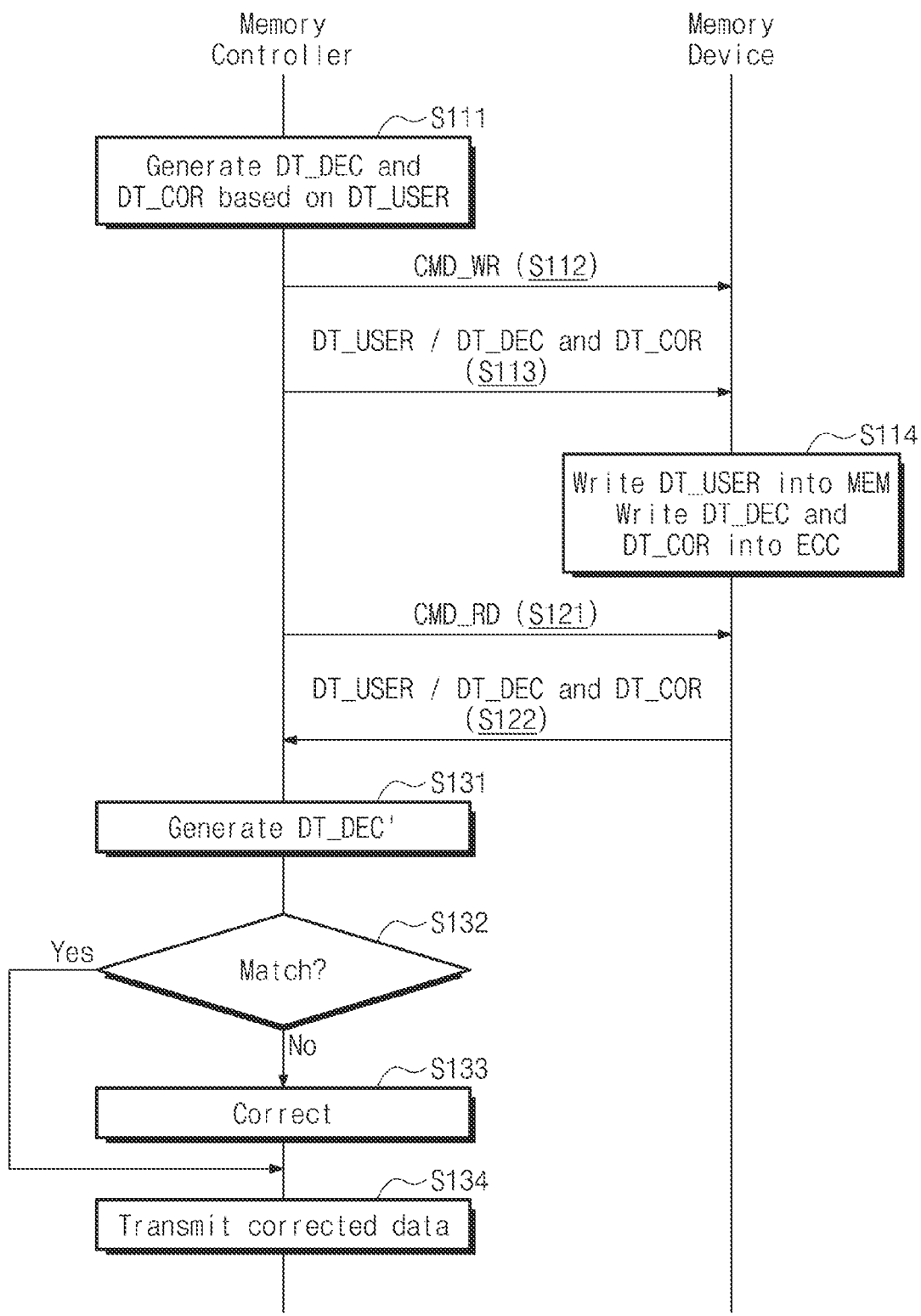
FIG. 12 is a flowchart illustrating an operation of a memory system of FIG. 1.

FIG. 12 is a flowchart illustrating an operation of a memory system of FIG. 1. In an embodiment, the memory module 110 that operates based on the flowchart of FIG. 12 may include the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7, and each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 may include the memory cell array 111c described with reference to FIG. 10. That is, a range of a random bit error that occurs due to a fault of each of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 included in the memory module 110 operating based on the flowchart of FIG. 12 may be 32 bits.

Referring to FIG. 1, FIG. 2, FIG. 10, and FIG. 12, in operation S111, the memory controller 120 may generate detection data DT_DEC and correction data DT_COR based on the user data DT_USER. The detection data DT_DEC may be considered first detection data, the correction data DT_COR may be first correction data, and the ECC engine 121 may be configured to generate the first detection data and the first correction data by performing an ECC operation on user data (e.g., first user data) in units of 32 bits. In an embodiment, the detection data DT_DEC may be data used to detect an error of data read from the memory module 110, and the correction data DT_COR may be data used to correct the error of the data read from the memory module 110. In an embodiment, the detection data DT_DEC may be a value generated through the CRC-32 calculation, and the correction data DT_COR may be even parity data, that is, a value generated through the even parity calculation. In an embodiment, in the case where the user data DT_USER are 64 bytes, a sum of the size of the detection data DT_DEC and the size of the correction data DT_COR may be 8 bytes. The detection data DT_DEC and the correction data DT_COR may be the ECC data DT_ECC.

In operation S112, the memory controller 120 may transmit the write command CMD_WR to the memory module 110. In operation S113, the memory controller 120 may transmit the user data DT_USER, the detection data DT_DEC, and the correction data DT_COR to the memory module 110. For example, the memory controller 120 may transmit the user data DT_USER to the first memory device MEM0 to fourth memory device MEM3 of the memory module 110 through the first to 32nd data lines DQ[31:0] of the first channel CHa and may transmit the detection data DT_DEC and the correction data DT_COR to the first ECC device ECC0 of the memory module 110 through the 33rd to 36th data lines DQ[35:32] of the first channel CHa.

In operation S114, the memory module 110 may store the user data DT_USER in memory devices (e.g., the first memory device MEM0 to the fourth memory device MEM3) and may store the detection data DT_DEC and the correction data DT_COR in an ECC device (e.g., ECC0).

In operation S121, the memory controller 120 may transmit the read command CMD_RD to the memory module 110. In an embodiment, the read command CMD_RD may be a command for reading the user data DT_USER stored in the memory module 110 through operation S111 to operation S114.

In operation S122, the memory module 110 may transmit the user data DT_USER, the detection data DT_DEC, and the correction data DT_COR to the memory controller 120. For example, the memory module 110 may transmit the user data DT_USER to the memory controller 120 through the first to 32nd data lines DQ[31:0] of the first channel CHa and may transmit the detection data DT_DEC and the correction data DT_COR to the memory controller 120 through the 33rd to 36th data lines DQ[35:32] of the first channel CHa.

In operation S131, the memory controller 120 may generate detection data DT_DEC' based on the user data DT_USER read from the memory module 110. The detection data DT_DEC' may be considered second detection data, and the ECC engine 121 may be configured to generate the second detection data based on user data (e.g., first user data) read from the memory module 110.

In operation S132, the memory controller 120 may compare the generated detection data DT_DEC' with the detection data DT_DEC received from the memory module 110. For example, in the case where an error is not included in the user data DT_USER received from the memory module 110, the generated detection data DT_DEC' and the detection data DT_DEC received from the memory module 110 may match. In contrast, in the case where an error is included in the user data DT_USER received from the memory module 110, the generated detection data DT_DEC' and the detection data DT_DEC received from the memory module 110 may not match. When the detection data DT_DEC' (e.g., the second detection data) are different from the detection data DT_DEC (e.g., the first detection data) read from the memory module 110, the ECC engine 121 may correct the 32-bit error of the user data (e.g., the first user data) based on the first correction data DT_COR read from the memory module 110.

In the case where an error is included in the user data DT_USER received from the memory module 110, in operation S133, the memory controller 120 may correct the error of the user data DT_USER. For example, the ECC engine 121 of the memory controller 120 may correct the error of the user data DT_USER by using the correction data DT_COR. In an embodiment, the correction data DT_COR may be even parity data, and the ECC engine 121 may correct the error of the user data DT_USER by performing the even parity calculation by using the correction data DT_COR. In operation S134, the memory controller 120 may output the corrected data to the external host.

In the case where an error is not included in the user data DT_USER received from the memory module 110, the memory controller 120 may perform operation S134. In this case, the data may be data that do not experience a separate error correction operation.

In an embodiment, a random bit error of the user data DT_USER received from the memory module 110 may be corrected or recovered through operation S131 to operation S133. That is, in the case of a conventional memory module having the UDIMM form factor, the size of ECC data is limited due to the limitation of the number of data lines; in this case, only the single bit error correction (SEC) is supported for user data. In contrast, according to the present disclosure, a random bit error of the user data DT_USER read from the memory module 110 may be corrected or recovered by using ECC data of the limited size by limiting a range of a random bit error capable of occurring due to a fault of each of memory devices to 32 bits.

Figure 13:
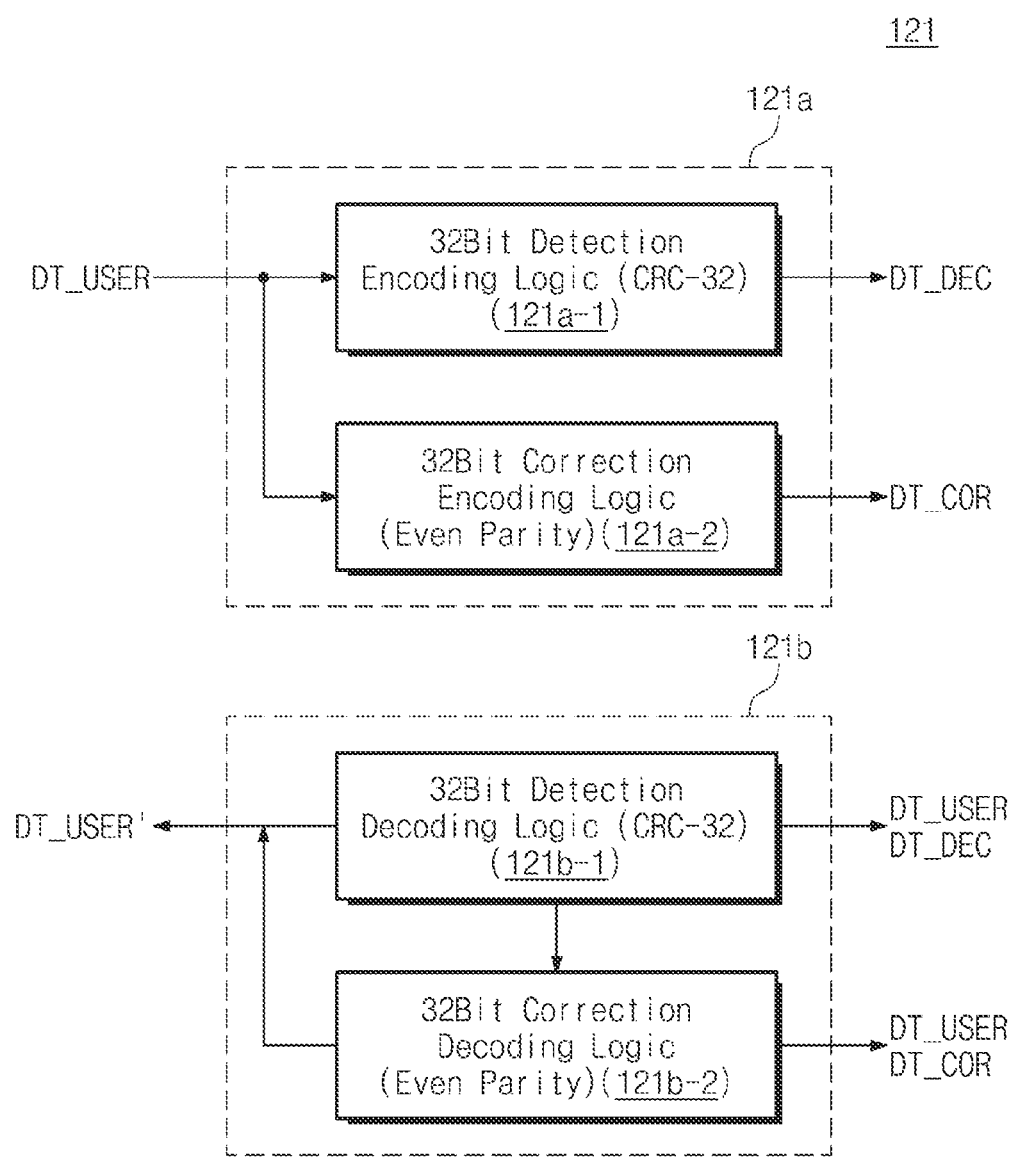
FIG. 13 is a block diagram illustrating an ECC engine of a memory module according to the flowchart of FIG. 12.

FIG. 13 is a block diagram illustrating an ECC engine of a memory module according to the flowchart of FIG. 12. Referring to FIG. 1, FIG. 12, and FIG. 13, the ECC engine 121 may include an encoding circuit 121a and a decoding circuit 121b. The encoding circuit 121a may generate the detection data DT_DEC and the correction data DT_COR based on the user data DT_USER to be stored in the memory module 110. For example, the encoding circuit 121a may include 32-bit detection encoding logic 121a-1 and 32-bit correction encoding logic 121a-2.

The 32-bit detection encoding logic 121a-1 may generate the detection data DT_DEC based on the user data DT_USER. The 32-bit correction encoding logic 121a-2 may generate the correction data DT_COR based on the user data DT_USER.

In an embodiment, the 32-bit detection encoding logic 121a-1 may generate the detection data DT_DEC by performing an operation on the user data DT_USER in units of 32 bits, and the 32-bit correction encoding logic 121a-2 may generate the correction data DT_COR by performing an operation on the user data DT_USER in units of 32 bits. In this case, each of the detection data DT_DEC and the correction data DT_COR may include 32 bits. In an embodiment, the 32-bit detection encoding logic 121a-1 may be CRC-32 logic, and the 32-bit correction encoding logic 121a-2 may be even parity logic.

The decoding circuit 121b may be configured to detect and correct an error of the user data DT_USER read from the memory module 110. For example, the decoding circuit 121b may include 32-bit detection decoding logic 121b-1 and 32-bit correction decoding logic 121b-2.

The 32-bit detection decoding logic 121b-1 may perform a decoding operation based on the user data DT_USER and the detection data DT_DEC received from the memory module 110. For example, the 32-bit detection decoding logic 121b-1 may generate the detection data DT_DEC' based on the user data DT_USER. The 32-bit detection decoding logic 121b-1 may determine whether an error is present in the user data DT_USER, by comparing the generated detection data DT_DEC' and the received detection data DT_DEC. In the case where an error is absent from the user data DT_USER, the 32-bit detection decoding logic 121b-1 may output the user data DT_USER without additional error correction. In the case where an error of the user data DT_USER is detected, the 32-bit detection decoding logic 121b-1 may correct and output the error of the user data DT_USER based on the received user data DT_USER and the received correction data DT_COR.

As described with reference to FIG. 13, the ECC engine 121 of the memory controller 120 may perform an ECC operation on the user data DT_USER in units of 32 bits; in this case, a 32-random bit error of the user data DT_USER may be corrected or recovered.

As described above, the memory module 110 of the present disclosure may have the UDIMM form factor. A conventional memory module of the UDIMM form factor supports only single bit error correction due to the limitation of the number of data lines. In contrast, according to the present disclosure, the memory module 110 may have the UDIMM form factor, and a range of a random bit error that occurs due to a fault of one of the first memory device MEM0, the second memory device MEM1, the third memory device MEM2, the fourth memory device MEM3, the fifth memory device MEM4, the sixth memory device MEM5, the seventh memory device MEM6, and the eighth memory device MEM7 included in the memory module 110 is limited to 32 bits. In this case, even though the number of data lines is limited, a random bit error of user data read from the memory module 110 may be corrected and recovered. The ECC engine 121 of the memory controller 120 may be configured to correct and recover the 32-random bit error of user data.

Figure 14:
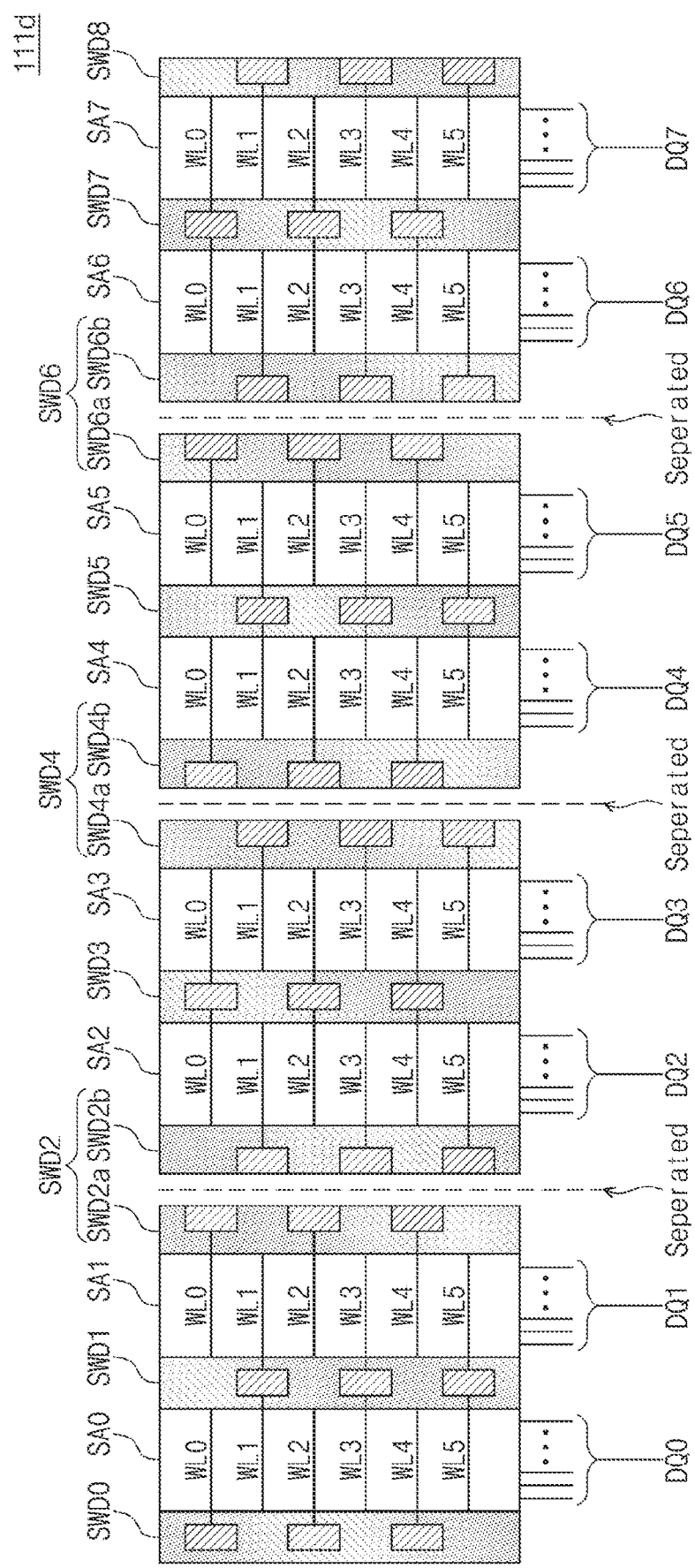
FIG. 14 is a diagram illustrating an example of a memory cell array of FIG. 5.

FIG. 14 is a diagram illustrating an example of a memory cell array of FIG. 5. Referring to FIG. 5 and FIG. 14, a memory cell array 111d may include a plurality of sub-arrays SA0 to SA7 and a plurality of sub-word line drivers SWD0 to SWD8. Configurations of some of the plurality of sub-arrays SA0 to SA7 and the plurality of sub-word line drivers SWD0 to SWD8 are similar to those described with reference to FIG. 10, and thus, additional description will be omitted to avoid redundancy.

The embodiment of FIG. 14 may be similar to the embodiment of FIG. 10 except that some sub-word line drivers drive different word lines. For example, in the embodiment of FIG. 14, the 3b-th sub-word line driver SWD2b may drive the odd-numbered word lines WL1, WL3, and WL5 of the third sub-array SA2, the fourth sub-word line driver SWD3 may drive the even-numbered word lines WL0, WL2, and WL4 of the third sub-array SA2 and fourth sub-array SA3, and the 5a-th sub-word line driver SWD4a may drive the odd-numbered word lines WL1, WL3, and WL5 of the fourth sub-array SA3. In the embodiment of FIG. 14, the 7b-th sub-word line driver SWD6b may drive the odd-numbered word lines WL1, WL3, and WL5 of the seventh sub-array SA6, the eighth sub-word line driver SWD7 may drive the even-numbered word lines WL0, WL2, and WL4 of the seventh sub-array SA6 and eighth sub-array SA7, and the ninth sub-word line driver SWD8 may drive the odd-numbered word lines WL1, WL3, and WL5 of the eighth sub-array SA7.

As in the memory cell array 111c of FIG. 10, an error may occur in the memory cell array 111d of FIG. 14 in units of two data lines. That is, a range of a random bit error occurring from a memory device including the memory cell array 111d of FIG. 14 may be limited to 32 bits.

Figure 15:
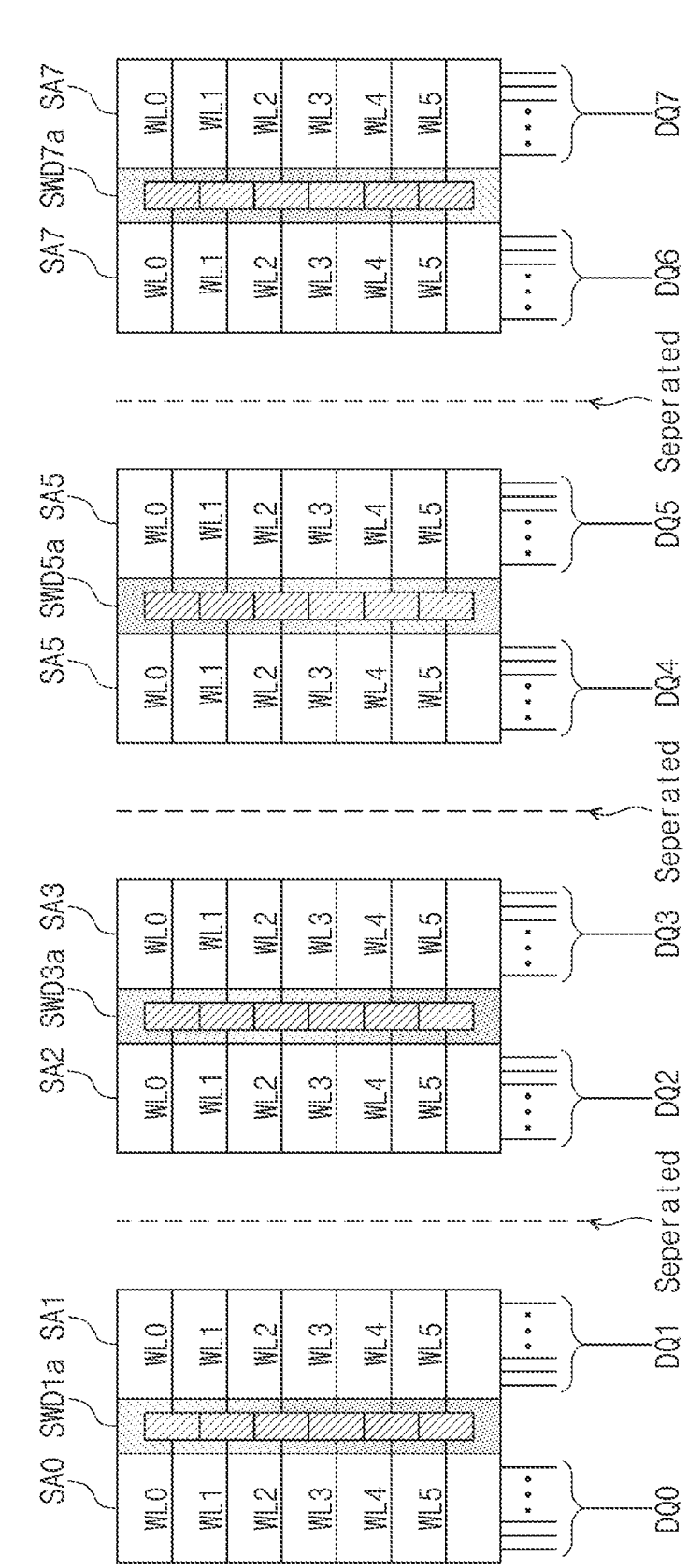
FIG. 15 is a diagram illustrating an example of a memory cell array of FIG. 5.

FIG. 15 is a diagram illustrating an example of a memory cell array of FIG. 5. Referring to FIG. 5 and FIG. 15, a memory cell array 111e may include a plurality of sub-arrays SA0 to SA7 and a plurality of sub-word line drivers SWD1a, SWD3a, SWD5a, and SWD7a.

The plurality of sub-arrays SA0 to SA7 may correspond to the plurality of data lines DQ0 to DQ7, respectively. The plurality of sub-word line drivers SWD1a, SWD3a, SWD5a, and SWD7a may be configured to control the word lines WL0 to WL5 connected with the plurality of sub-arrays SA0 to SA7.

The 2a-th sub-word line driver SWD1a may drive the word lines WL0 to WL5 of the first and second sub-arrays SA0 and SAL The 4a-th sub-word line driver SWD3a may drive the word lines WL0 to WL5 of the third sub-array SA2 and fourth sub-array SA3. The 6a-th sub-word line driver SWD5a may drive the word lines WL0 to WL5 of the fifth sub-array SA4 and sixth sub-array SA5. The 8a-th sub-word line driver SWD7a may drive the word lines WL0 to WL5 of the seventh sub-array SA6 and eighth sub-array SA7.

In an embodiment, in the case where one of the plurality of sub-word line drivers SWD1a, SWD3a, SWD5a, and SWD7a is faulty, an error may occur in units of two data lines. That is, as in the above description, a range of a random bit error occurring from a memory device including the memory cell array 111e of FIG. 15 may be limited to 32 bits.

As described above, a memory device according to the present disclosure may be configured in such a way that an error occurs in units of two data lines, that is, may be configured to limit a range of a random bit error to 32 bits. The memory cell arrays 111c, 111d, and 111e described with reference to FIG. 10, FIG. 14, and FIG. 15 are some examples, and the present disclosure is not limited thereto. A memory cell array according to the present disclosure may be implemented in various forms such that a range of a random bit error is limited to a specific range.

As described above, according to embodiments of the present disclosure, a memory module may have the UDIMM form factor. A memory controller configured to control a conventional memory module having the UDIMM form factor provides only a single bit error correction function due to the number of data lines limited according to the UDIMM form factor. However, according to embodiments of the present disclosure, each of a plurality of memory devices included in a memory module may be configured to have a limited range of a random bit error; in this case, an ECC engine of a memory controller may be configured to correct and recover the random bit error. Accordingly, the reliability of the memory module having the UDIMM form factor may be improved.

In the above embodiments, to describe embodiments of the present disclosure easily, a memory module is described as having the UDIMM form factor, but the present disclosure is not limited thereto. For example, a memory module according to the present disclosure may be implemented in various DIMM forms having data lines, the number of which is limited, such as an SODIMM.

Figure 16:
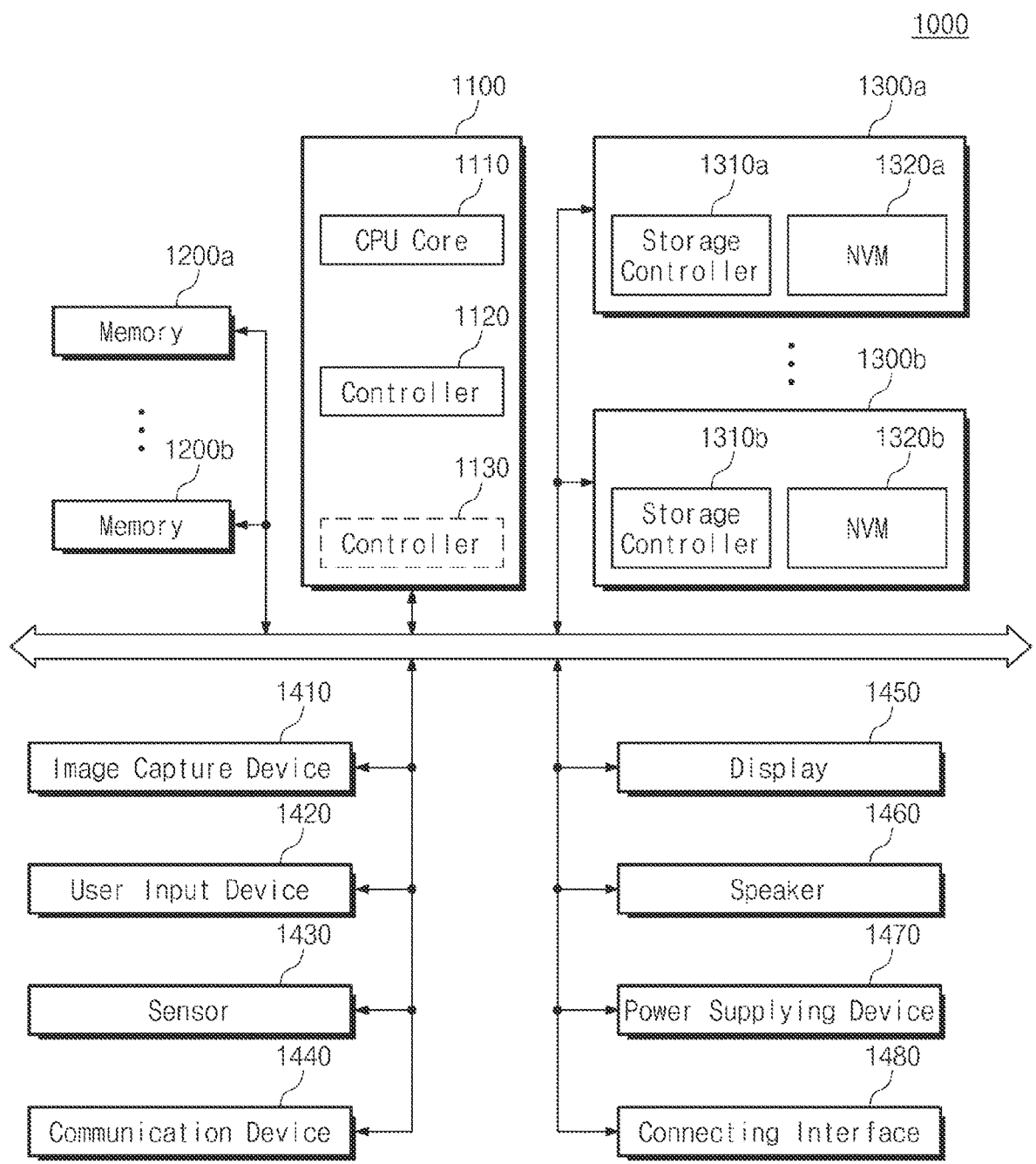
FIG. 16 is a diagram illustrating a computer system to which a memory system according to an embodiment of the present disclosure is applied.

FIG. 16 is a diagram of a computer system 1000 to which a memory system is applied, according to an embodiment. The computer system 1000 of FIG. 16 may basically be a mobile system, such as a portable communication terminal (e.g., a mobile phone), a smartphone, a tablet personal computer (PC), a wearable device, a healthcare device, or an Internet of things (IOT) device. However, the computer system 1000 of FIG. 1 is not necessarily limited to the mobile system and may be a PC, a laptop computer, a server, a media player, or an automotive device (e.g., a navigation device).

Referring to FIG. 16, the computer system 1000 may include a main processor 1100, memories (e.g., 1200a and 1200b), and storage devices (e.g., 1300a and 1300b). In addition, the computer system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the computer system 1000, more specifically, operations of other components included in the computer system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the computer system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

In an embodiment, the memory module 110 described with reference to FIG. 1 through FIG. 15 may correspond to each of the memories 1200a and 1200b of FIG. 16, and the memory controller 120 described with reference to FIG. 1 through FIG. 15 may be the main processor 1100 of FIG. 16 or may be included in the main processor 1100. The main processor 1100 and the memories 1200a and 1200b of FIG. 16 may operate based on the operation methods described with reference to FIG. 1 through FIG. 15.

The storage devices 1300a and 1300b may serve as non-volatile storage devices configured to store data regardless of whether power is supplied thereto, and have larger storage capacity than the memories 1200a and 1200b. The storage devices 1300a and 1300b may respectively include storage controllers 1310a and 1310b (STRG CTRL) and NVMs 1320a and 1320b (Non-Volatile Memory) configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the computer system 1000 or implemented in the same package as the main processor 1100. In addition, the storage devices 1300a and 1300b may have types of solid-state devices (SSDs) or memory cards and be removably combined with other components of the memory system 100 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the computer system 1000 and include a touch pad, a keypad, a keyboard, a mouse, and/or a microphone.

The sensor 1430 may detect various types of physical quantities, which may be obtained from the outside of the computer system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the computer system 1000 according to various communication protocols. The communication device 1440 may include an antenna, a transceiver, and/or a modem.

The display 1450 and the speaker 1460 may serve as output devices configured to respectively output visual information and auditory information to the user of the computer system 1000.

The power supplying device 1470 may appropriately convert power supplied from a battery (not shown) embedded in the computer system 1000 and/or an external power source, and supply the converted power to each of components of the computer system 1000.

The connecting interface 1480 may provide connection between the computer system 1000 and an external device, which is connected to the computer system 1000 and capable of transmitting and receiving data to and from the computer system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

According to the present disclosure, a memory module may have the UDIMM form factor. Each of a plurality of memory devices included in the memory module may be configured to determine a random bit error in units of two data lines. That is, a random bit error that occurs due to a fault of one of the plurality of memory devices is limited to 32 bits. An ECC engine of a memory controller may include an ECC engine configured to correct and recover a 32-random bit error. That is, a conventional UDIMM supports only single bit error correction due to the limitation of the number of data lines. However, according to the present disclosure, as a range of a random bit error occurring in each memory device is limited, the correction and recovery of the random bit error is possible. Accordingly, a memory module, a memory system, and an operation method of a memory controller, which are capable of improving reliability, are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A memory system, comprising:
   a memory module including a first memory device, a second memory device, a third memory device, and a fourth memory device, and a first error correction code (ECC) device; and
   a memory controller configured to exchange first user data with each of the first memory device, the second memory device, the third memory device, and the fourth memory device through 8 data lines and to exchange first ECC data with the first ECC device of the memory module through 4 data lines,
   wherein the memory controller includes an ECC engine configured to detect and correct a 32-random bit error of the first user data based on the first ECC data,
   wherein the first ECC data include first detection data and first correction data,
   wherein the ECC engine of the memory controller is configured to generate the first detection data and the first correction data by performing an ECC operation on the first user data in units of 32 bits and to generate second detection data based on the first user data read from the memory module, and
   wherein, when the second detection data are different from the first detection data read from the memory module, the ECC engine of the memory controller is configured to perform correction of the 32-random bit error of the first user data based on the first correction data read from the memory module.

2. The memory system of claim 1,
   wherein the first detection data are generated by performing a CRC-32 calculation on the first user data, and
   wherein the first correction data are generated by performing an even parity calculation on the first user data.

3. The memory system of claim 1, wherein each of the first memory device, the second memory device, the third memory device, and the fourth memory device includes:
   a first sub-array, a second sub-array, a third sub-array, a fourth sub-array, a fifth sub-array, a sixth sub-array, a seventh sub-array, and an eighth sub-array corresponding to a first data line, a second data line, a third data line, a fourth data line, a fifth data line, a sixth data line, a seventh data line, and an eighth data line, respectively; and
   a plurality of sub-word line drivers configured to control a plurality of word lines connected with the first sub-array to eighth sub-array.

4. The memory system of claim 3, wherein, in the plurality of sub-word line drivers,
   first sub-word line drivers configured to control word lines connected with the first sub-array and second sub-array,
   second sub-word line drivers configured to control word lines connected with the third sub-array and fourth sub-array,
   third sub-word line drivers configured to control word lines connected with the fifth sub-array and sixth sub-array, and
   fourth sub-word line drivers configured to control word lines connected with the seventh sub-array and eighth sub-array are physically separated from each other.

5. The memory system of claim 4, wherein the 32-random bit error occurs due to a fault of one of the first memory device to fourth memory device.

6. The memory system of claim 5, wherein, when the one of the first memory device to fourth memory device is faulty, the 32-random bit error occurs in bits output from the first data line and second data line, the third data line and fourth data line, the fifth data line and sixth data line, or the seventh data line and eighth data line of the first data line to eighth data line connected with the one of the first memory device to fourth memory device which is faulty.

7. The memory system of claim 1, wherein a size of the first user data is 64 bytes, and a size of the first ECC data is 8 bytes.

8. The memory system of claim 1, wherein the memory module has a form factor of an unbuffered dual in-line memory module (UDIMM) or a small outline dual in-line memory module (SODIMM).

9. The memory system of claim 1, wherein the ECC engine of the memory controller comprises:
   an encoding logic configured to generate the first detection data and the first correction data; and
   a decoding logic configured to generate the second detection data.

10. The memory system of claim 9, wherein the encoding logic comprises:

a 32-bit detection encoding logic configured to generate the first detection data; and
a 32-bit correction encoding logic configured to generate the first correction data.

11. The memory system of claim 9, wherein the decoding logic comprises:
a 32-bit detection decoding logic configured to generate the second detection data and determine whether the 32-random bit error is present in the first user data; and
a 32-bit correction decoding logic configured to perform the correction of the 32-random bit error of the first user data when the 32-random bit error is detected.

12. An operation method of a memory controller configured to control a memory module having a form factor of an unbuffered dual in-line memory module (UDIMM), the method comprising:
generating detection data and correction data based on user data;
writing the user data, the detection data, and the correction data into the memory module;
reading the user data, the detection data, and the correction data from the memory module;
detecting, by the memory controller, a random bit error of the user data based upon a difference between the detection data read from the memory module and the detection data written into the memory module;
correcting, by the memory controller, the random bit error of the user data based on the correction data to produce corrected user data; and
outputting the corrected user data.

13. The method of claim 12,
wherein the memory module includes a plurality of memory devices and an error correction code (ECC) device, and
wherein the plurality of memory devices are connected with the memory controller through "a×N" data lines, wherein "a" is a number of the plurality of memory devices and N is a natural number greater than 1, and the ECC device is connected with the memory controller through "M" data lines, wherein M being is a natural number smaller than the N.

14. The method of claim 13, wherein the writing of the user data, the detection data, and the correction data in the memory module includes:
transmitting a write command to the memory module; and
transmitting the user data through the "a×N" data lines connected with each of the plurality of memory devices and transmitting the detection data and the correction data through the "M" data lines connected with the ECC device.

15. The method of claim 14, wherein the "a" is 4, the "N" is 8, and the "M" is 4.

16. The method of claim 14, wherein the reading of the user data, the detection data, and the correction data from the memory module includes:
transmitting a read command to the memory module; and
receiving the user data through the "a×N" data lines connected with each of the plurality of memory devices and receiving the detection data and the correction data through the "M" data lines connected with the ECC device.

17. The method of claim 12, wherein the correction data are generated by performing an even parity calculation on the user data, and wherein the random bit error is corrected by performing the even parity calculation on the user data based on the correction data.

18. A memory module having a form factor of an unbuffered dual in-line memory module (UDIMM), comprising:
a first memory device connected with an external memory controller through a first data line, a second data line, a third data line, a fourth data line, a fifth data line, a sixth data line, a seventh data line, and an eighth data line;
a first error correction code (ECC) device connected with the external memory controller through a first check bit line, a second check bit line, a third check bit line, and a fourth check bit line, the first ECC device being configured to detect a random bit error of user data output from the first memory device based upon a difference between read detection data and written detection data, store error detection data associated with the random bit error, correct the random bit error by performing an even parity calculation on the user data to produce correction data associated with the random bit error, and store the correction data,
wherein the first memory device includes:
a first sub-array, a second sub-array, a third sub-array, a fourth sub-array, a fifth sub-array, a sixth sub-array, a seventh sub-array, and an eighth sub-array corresponding to the first data line, the second data line, the third data line, the fourth data line, the fifth data line, the sixth data line, the seventh data line, and the eighth data line, respectively;
first sub-word line drivers configured to control word lines connected with the first sub-array and second sub-array;
second sub-word line drivers configured to control word lines connected with the third sub-array and fourth sub-array;
third sub-word line drivers configured to control word lines connected with the fifth sub-array and sixth sub-array; and
fourth sub-word line drivers configured to control word lines connected with the seventh sub-array and eighth sub-array,
wherein the first sub-word line drivers, the second sub-word line drivers, the third sub-word line drivers, and the fourth sub-word line drivers are physically separated from each other.

19. The memory module of claim 18, wherein, when at least one of the first sub-word line drivers is faulty, the random bit error occurs in bits output through the first data line and second data line,
wherein, when at least one of the second sub-word line drivers is faulty, the random bit error occurs in bits output through the third data line and fourth data line,
wherein, when at least one of the third sub-word line drivers is faulty, the random bit error occurs in bits output through the fifth data line and sixth data line, and
wherein, when at least one of the fourth sub-word line drivers is faulty, the random bit error occurs in bits output through the seventh data line and eighth data line.

* * * * *